United States Patent
Wei

(10) Patent No.: US 7,941,768 B1
(45) Date of Patent: May 10, 2011

(54) PHOTOLITHOGRAPHIC PROCESS SIMULATION IN INTEGRATED CIRCUIT DESIGN AND MANUFACTURING

(75) Inventor: Haiqing Wei, Jan Jose, CA (US)

(73) Assignee: oLambda, Inc., Los Altos, CA (US)

( * ) Notice: Subject to any disclaimer, the term of this patent is extended or adjusted under 35 U.S.C. 154(b) by 956 days.

(21) Appl. No.: 11/708,299

(22) Filed: Feb. 20, 2007

Related U.S. Application Data

(63) Continuation-in-part of application No. 11/795,808, filed on Dec. 3, 2009, which is a continuation of application No. 11/331,223, filed on Jan. 11, 2006, now abandoned.

(60) Provisional application No. 60/775,385, filed on Feb. 21, 2006, provisional application No. 60/822,288, filed on Aug. 14, 2006, provisional application No. 60/828,993, filed on Oct. 11, 2006, provisional application No. 60/774,329, filed on Feb. 17, 2006.

(51) Int. Cl.
    *G06F 17/50* (2006.01)

(52) U.S. Cl. ............ 716/54; 716/50; 716/102; 716/106; 716/130

(58) Field of Classification Search .................... 716/13, 716/21, 5, 19, 50, 54, 102, 106, 130
See application file for complete search history.

(56) References Cited

U.S. PATENT DOCUMENTS

| | | | |
|---|---|---|---|
| 6,578,190 B2 * | 6/2003 | Ferguson et al. | 716/21 |
| 6,728,937 B2 | 4/2004 | Wakita et al. | |
| 6,775,818 B2 * | 8/2004 | Taravade et al. | 716/21 |
| 7,003,758 B2 * | 2/2006 | Ye et al. | 716/21 |
| 7,266,800 B2 | 9/2007 | Sezginer | |
| 7,624,369 B2 * | 11/2009 | Graur et al. | 716/19 |
| 2002/0091986 A1 * | 7/2002 | Ferguson et al. | 716/19 |
| 2004/0133871 A1 | 7/2004 | Granik et al. | |
| 2005/0015233 A1 | 1/2005 | Gordon | |
| 2005/0114822 A1 | 5/2005 | Axelrad et al. | |
| 2005/0185159 A1 | 8/2005 | Rosenbluth et al. | |
| 2005/0204322 A1 | 9/2005 | Kotani et al. | |
| 2005/0216877 A1 | 9/2005 | Pack et al. | |
| 2005/0229125 A1 | 10/2005 | Tabery et al. | |
| 2005/0251771 A1 * | 11/2005 | Robles | 716/5 |
| 2006/0019176 A1 * | 1/2006 | Kim et al. | 430/5 |
| 2006/0034505 A1 | 2/2006 | Luk-Pat et al. | |

(Continued)

FOREIGN PATENT DOCUMENTS
WO WO2005/098686 A2 10/2005

OTHER PUBLICATIONS
Schetzen, Martin. "Nonlinear System Modeling Based on the Wiener Theory", *Proceedings of the IEEE*, vol. 69, No. 12, Dec. 1981.

(Continued)

*Primary Examiner* — Sun J Lin
(74) *Attorney, Agent, or Firm* — Cooper & Dunham, LLP

(57) ABSTRACT

A method, system, and related computer program products for computer simulation of a photolithographic process is described. In one embodiment, a method for designing an integrated circuit is provided. The geometrical design intent and process condition values are received for at least one process variation associated with a photolithographic process to be used in fabricating the integrated circuit. The photolithographic process is simulated at the process condition values using one or more models characterizing the photolithographic process and the geometrical design intent to generate simulation results.

100 Claims, 16 Drawing Sheets

U.S. PATENT DOCUMENTS

| | | |
|---|---|---|
| 2006/0269875 A1 | 11/2006 | Granik |
| 2007/0198963 A1 | 8/2007 | Granik et al. |
| 2007/0204242 A1* | 8/2007 | Brunet et al. .................. 716/2 |
| 2007/0204256 A1* | 8/2007 | Brunet et al. .................. 716/13 |
| 2008/0059128 A1 | 3/2008 | Tejnil |
| 2008/0134131 A1 | 6/2008 | Asano et al. |

OTHER PUBLICATIONS

Cobb, Nicolas Bailey. "Fast Optical and Process Proximity Correction Algorithms for Integrated Circuit Manufactoring," Ph.D. Dissertation, University of California at Berkeley, 1998.

Shi, Xuelong, et al. "Eigen Decomposition Based Models for Model OPC," Proceedings of SPIE vol. 5446, pp. 462-470, 2004.

Martin, Patrick et al. "Exploring new high speed, mask aware RET verification flows," Proceedings of SPIE vol. 5853, pp. 114-123, 2005.

Pati, Y.C., et al. "Exploiting Structure in Fast Aerial Image Computation for Integrated Circuit Patterns," *IEEE Transactions on Semiconductor Manufactoring*, vol. 10, No. 1, pp. 62-74, Feb. 2007.

* cited by examiner non-printing    broken T-junction    bridged line-ends

0
PHOTOLITHOGRAPHIC PROCESS SIMULATION IN INTEGRATED CIRCUIT DESIGN AND MANUFACTURING

CROSS-REFERENCE TO RELATED APPLICATIONS

This patent application is a continuation-in-part of U.S. Ser. No. 11/795,808 filed Dec. 3, 2009, which is a continuation of U.S. Ser. No. 11/331,223, filed Jan. 11, 2006, now abandoned. This patent application also claims the benefit of U.S. Ser. No. 60/774,329, filed Feb. 17, 2006, U.S. Ser. No. 60/775,385, filed Feb. 21, 2006, U.S. Ser. No. 60/775,385, filed Feb. 21, 2006, U.S. Ser. No. 60/822,288, filed Aug. 14, 2006, and Ser. No. 60/828,993, filed Oct. 11, 2006. Each of the above-referenced patent applications is incorporated by reference herein. The subject matter of this patent application is also related to the subject matter of U.S. Ser. No. 11/708,444, which is being filed on the same day as the present application, and which is incorporated by reference herein.

FIELD

This patent specification relates to design and manufacture of integrated circuits (ICs). More particularly, the patent specification relates to improved design and manufacture of ICs through computer simulation of photolithographic processes.

BACKGROUND

In a conventional method for flow or IC design and manufacturing, a designer (which may be, and usually is, a group of engineers) at the back-end design stage synthesizes a physical layout of circuit patterns and verifies the layouts using various tools. The layout is often called a mask layout, which is a misnomer. The layout actually describes designed and desired or intended patterns on a wafer, and the designer is actually designing wafer patterns for the circuit. The designer typically uses an RC-extraction tool to estimate the resistance and capacitance parameters based on the layout, and runs a circuit simulator based on the RC (transistor characteristics, resistance and capacitance, even including inductance) parameters to verify the functionality of the designed IC. Upon verification, the designer "tapes-out" the layout of wafer patterns to a process group, or a "fab" (that is, a semiconductor fabrication facility), in the same company, affiliate company, or an independent foundry. The fab or process group then has to create a set of masks corresponding to the layout of wafer patterns, before using the masks in photolithography machines to produce the wafer patterns. Patterns on mask are often quite dissimilar to the wafer patterns in order to fabricate semiconductor chips consisting of sub-wavelength features.

These conventional design methods and workflows are becoming increasingly inconvenient, and sometimes non-functional, as a result of requiring increasingly more complicated optical proximity correction (OPC) to the masks and other resolution enhancement techniques (RETs), in order to fabricate deep-sub-wavelength wafer patterns. The difficulty has two aspects. On one hand, unaware of what OPC/RETs may be employed to synthesize the masks, the designer does not know exactly how to avoid creating wafer patterns that are beyond the capability of the process technology to be used, even with the help of OPC/RETs, which lead to non-manufacturable or low-yield chip designs. On the other hand, uninformed about the intents of the device, circuit, and logic of a design, the fab or process group should not replace, re-route, or otherwise modify the designed wafer patterns in a drastic manner, when trying to fix a "hot-spot" on wafer layout that is difficult to fabricate or completely beyond the process capability. Even being able to approximately produce the designed wafer patterns with the help of OPC/RETs, there are unavoidable deviations of actually obtained wafer patterns from the designed, which lead to uncontrolled variations of RC parameters, and in turn uncontrolled variations of signal timing and integrity, that eventually may result in parametric chip failure.

Typical IC design includes as part of the physical design, steps of physical layout, design rule check (DRC), RC extraction and electric rule check (ERC), timing analysis and signal integrity check, power and thermal analyses etc. (see, for example, M. D. Birnbaum, *Essential Electronic Design Automation (EDA)*, Prentice Hall, 2004). The IC design data passed to the physical layout tools is typically a netlist of devices generated by a prior step, with the devices characterized by electrical parameters. The physical layout step continues the design flow by creating mask patterns that will be used in the manufacturing process to generate intended patterns on a semiconductor (usually silicon) wafer, hereinafter referred collectively as the design intent. The DRC/ERC steps then make sure that there is no violation to a set of design constraints in the intended patterns. The set of design constraints consists of requirements and restrictions on the intended patterns, and/or extracted RC parameters from the intended patterns, as well as circuit timing, signal integrity, and device power consumption, etc. For example, a set of geometric design constraints may require that (1) the linewidth of an intended pattern feature has to be wider than a first limit and narrower than a second limit, (2) the spacing between two intended pattern features has to be more than a third limit, and (3) an edge of an intended pattern feature has to be accurately placed at a desired location within a predetermined tolerance. Among the above exemplary design constraints, the first two types are referred to as feature-size bounds, since they set requirements and restrictions on the sizes of lines or spaces, or equivalently, on the distances between pairs of edges of intended pattern features. The third type is referred to as edge placement bounds, since it dictates where edges have to be located to within a tolerance. For another example, a set of electric design constraints may require that (1) the resistance of a metal or semiconductor structure be within a first range, (2) the capacitance between two metal or semiconductor structures be within a second range. Some design constraints may be requirements from the theory and experiments of device physics, which have to be satisfied in order for the fabricated devices to function properly. Other design constraints may come from theoretical and empirical restrictions imposed by the manufacturing process, which are experiences and experimental results accumulated over time. Such constraints are employed to ensure that the intended patterns lead to functioning devices.

Note that as used herein, the term "design constraints" is intended to be broader than the conventional term "design rules" that refers to geometric design rules, such as feature-size bounds and edge-placement bounds. As used herein, "design constraints" refers to conventional "design rules" as well as other types of constraints, such as electric parameter constraints, signal timing constraints, signal integrity constraints, and chip power consumption constraints, etc.

In the so-called deep-sub-wavelength regime, the features on wafers are so tiny (less than half of the wavelength of the exposure light, which, for example, may be 193 nm or below) and so dense that it is becoming increasingly difficult to create actual patterns on the wafer, referred as wafer patterns, resembling with high fidelity the intended patterns drawn by IC design engineers/tools. It is necessary to distinguish between (1) the intended patterns generated during physical design and (2) the actual patterns created on wafers during the manufacturing process. The former are called intended patterns because they are laid out by IC designers/tools and represent the intended microelectronic features to realize the desired devices and circuits. The latter are called wafer patterns because they are the patterns actually obtained on a processed wafer. Although the wafer patterns may never be exactly the same as the intended patterns, a manufacturing process ideally should be optimized so as to minimize the difference. Conventional DRC tools check the intended patterns against the design constraints. This conventional technique has significant drawbacks, however, due to the inevitable difference between the intended and wafer patterns. Attempts have been made to perform process verification that uses a computer model simulating the manufacturing process, and predict wafer patterns using computer simulations. The predicted wafer patterns are then checked against the design constraints, in an attempt to ascertain whether all predicted wafer patterns fall within the feature-size and edge-placement bounds as well as other constraints. Such simulation-based tools of process verification have been implemented in commercial software products, being called variously as litho rule checking (LRC), silicon versus layout (SiVL) from Synopsys®, optical rule checking (ORC), and OPC verification (OPCverify) (See, for example, see the Calibre MDP product line from Mentor Graphics®.) However, existing products of simulation-based process verification are only capable of modeling a manufacturing process and simulating the wafer patterns under one, usually the best, process condition. For example, the simulations usually assume a process under the best focus of the lithographic imaging system (often referred as the optical stepper) and the ideal level of exposure dosage. Practical manufacturing is always subject to process variations. Defocus, which is deviation of the wafer position from the best focal surface, and fluctuation of exposure dosage are but two sources of process variations among others. Such process variations could degrade the quality of lithographic pattern transfer, resulting in wafer patterns that fall out of the feature-size and edge-placement bounds, which eventually lead to yield loss. PCT Published Application No. WO 2005/098686 entitled "Modeling Resolution Enhancement Process in Integrated Circuit Fabrication" proposes a Wafer Image Modeling and Prediction System that includes systems and methods that generate and/or apply models of resolution enhancement techniques ("RET") and printing processes in IC fabrication. However, in order to characterize more than a single process condition, being proposed is the use of multiple printing models each of which is associated with and derived using a discrete process condition. The generation and use of such multiple printing models involve excessive complexity and cost for test wafer exposures, test data measurements, model calibrations, and applications of models in printing simulations. Furthermore, the validity of such multiple discrete models is limited to strictly the discrete process conditions used for model calibration, or within rather small regions in close proximity to the corresponding discrete process conditions. Thus there is a need for simulation techniques that do not require separate derivation of models for each discrete processing condition.

SUMMARY

A method, system, related computer program products, for computer simulation of a photolithographic process and integrated circuit design and manufacturing are provided. In one embodiment, a system for designing an integrated circuit is provided. A computer input/output system is adapted to receive a geometrical design intent for an integrated circuit, along with values for one or more process variations associated with a photolithographic process to be used in fabricating the integrated circuit. A processor is configured and programmed to simulate the photolithographic process at the process conditions using one or more models characterizing the photolithographic process and the geometrical design intent to generate simulation results. Preferably, condition values were not used in the generation of said one or more models. A portion of the geometrical design intent is re-routed so as to improve the manufacturability of the integrated circuit.

In another embodiment, a method for designing an integrated circuit is provided. The geometrical design intent and process condition values are received for at least one process variation associated with a photolithographic process to be used in fabricating the integrated circuit. The photolithographic process is simulated at the process condition values using one or more models characterizing the photolithographic process and the geometrical design intent to generate simulation results. Preferably, the condition values were not used in the generation of said one or more models. In response to the simulation, a portion of the geometrical design intent is re-routed so as to improve the manufacturability of the integrated circuit.

In another embodiment, a method for simulating a photolithographic process of a design onto a target is provided. The photolithographic process is simulated over a substantially large physical area of the target for a plurality process condition values for one or more process variations associated with the photolithographic process. The process variations preferably include at least one variation that is neither dose/exposure nor focus/defocus.

DETAILED DESCRIPTION

Figure 1:
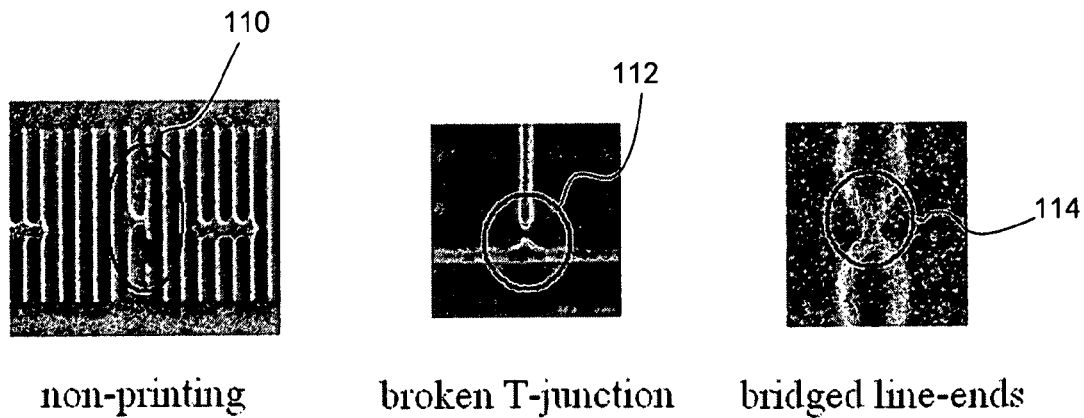
FIG. 1 illustrates examples of water patterns that have failed certain design constraints.

Process variations in general tend to degrade the quality of lithographic pattern transfer, sometimes resulting in wafer patterns that fall out of the feature-size and edge-placement bounds. FIG. 1 illustrates examples of water patterns that have failed certain design constraints. Region 110 shows an example of a non-printing error, where the linewidth of a pattern feature becomes too narrow and even zero, Region 112 shows and example of a broken T-junction, and Region 114 shows an example of bridged line ends, where the spacing between two pattern features becomes too small and even zero, all of which eventually lead to yield loss.

Figure 2:
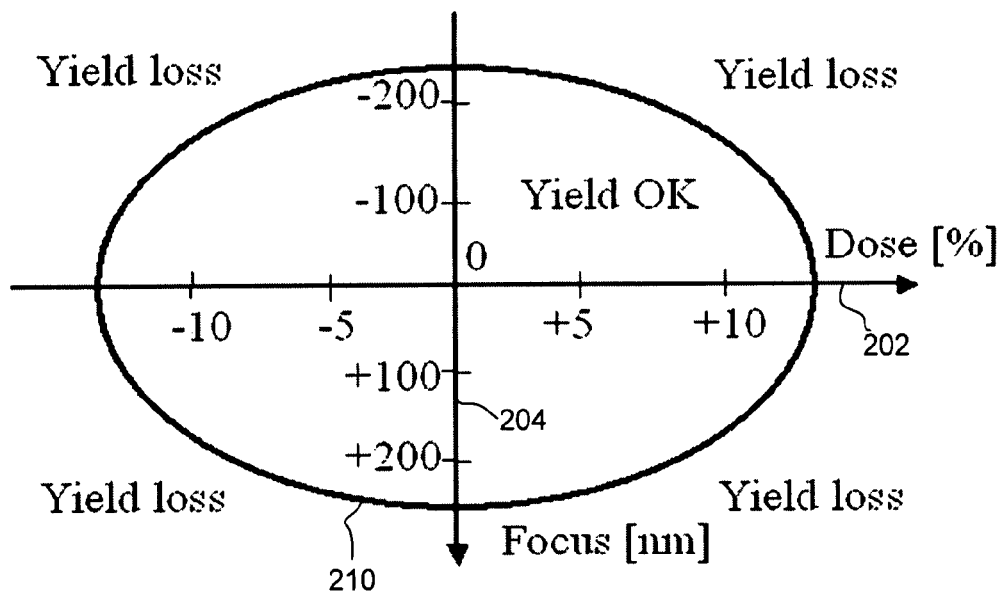
FIG. 2 illustrates a process window according to an embodiment.

Embodiments of the invention described herein advantageously provide the capability for various features including: process verification, modeling process variations, sampling over a relatively wide space of variable process parameters, predicting wafer patterns under variations of process parameters, identifying pattern defects, and marking the boundary between the good process region where wafer patterns may be created within spec and the bad process region where the process variations are too large to print wafer patterns in good quality. Such boundary between the good and bad process regions may be called a boundary of yield (BOY) in the space of process variations. FIG. 2 illustrates a process window according to an embodiment. Shown in FIG. 2 is a space of two common process variations, Dose on horizontal axis 202 in percentage, and Focus on vertical axis 204 in nanometers. Note that although a two-dimensional process variable space, that is with two process variations, is commonly depicted herein for ease of visualization, in general there can be any number of process variations, including 3 or more in a given process variable space. Also, while Dose and Focus are shown as the two process variables in the example of FIG. 2, those of skill in the art will recognize that there are many common process variables which may be used including, but not limited to: exposure dose variations, intensity variations of multiple light emitters, light source chromatic variations, coherence variations, light source positioning variations, defocus variations, lens aberrations, exposure-field-dependent defocus variations and lens aberrations (that are defocus variations and lens aberrations dependent on locations within the field of view, or called exposure field, of the optical exposure system), immersion medium refractive index variations, immersion medium attenuation coefficient variations, stack film thickness variations, stack film material refractive index variations, stack film material attenuation coefficient variations, mask pattern errors, mask topography variations, mask material property variations, and other mask errors, photoresist optical property variations, photoresist chemical property variations, photoresist-development material variations, photoresist-development environment variations, photoresist-development process variations, etching material variations, etching environment variations, etching process variations, temperature variations, pressure variations, and processing time variations of different process steps. Shown in the process variable space of FIG. 2 is closed curve 210, which represents the boundary of yield. Process conditions (variations) within the boundary curve 210 are expected to produce good wafer patterns and hence well-functioning chips (that is, "yield OK"), whereas process conditions outside the boundary curve 210 are expected to induce pattern failures or large deviations of device electrical characteristics that cause chips failures (that is, "yield loss").

Conventional simulation-based tools are not well suited for such yield-oriented process verification, because in general they lack a process model that is capable of simulating variational process conditions, and is ab initio or from first principles to provide sufficient modeling accuracy and simulation speed at the same time. Rather, their process models often are based upon or incorporate empirical assumptions about the processes of optical imaging, resist development, and chemical etching, that are not general principles governing the underlying physical and chemical processes. Such models are usually calibrated using test data under a single, usually the best, process condition, and efforts are made to add and tweak empirical formulas and parameters until the best fit to the measured data is reached. A model built in this manner may reasonably predict the process behavior under the calibrated condition. However, the empirical assumptions lack the generality to make the models useful in simulating process deviations from the calibrated condition.

According to an embodiment, the capability is provided to locate the boundary of yield for a given chip design, with respect to a given set of geometric/electric constraints, or design constraints, such as lower and upper bounds on the sizes of geometric features, bounds on edge-placement errors, and bounds on electric parameters extracted from geometric features, etc. Given a design of a whole chip, the boundary of yield encloses a process region where the entire chip would yield OK, whereas any process condition outside of the boundary of yield would lead to certain violations to some of the design constraints at some place(s) in the chip. To determine the boundary of yield with high precision and reduced complexity, a search program preferably runs simulations for sampled variation points on a relatively coarse grid, and checks simulation results against the design constraints, so to locate the boundary of yield within a union of variation cells (which may be parallelograms, parallelepipeds, or parallelotopes in a process variable space with a dimension higher than three), each of which has sampled variation points on corners but none inside. Then the search program preferably subdivides each yield-boundary-containing variation cell into smaller portions, and run simulations to identify smaller variation cell portions that contain the boundary of yield. Such procedure is preferably repeated until the size of the yield-boundary-containing variation cells matches a desired precision, or the yield-boundary may be interpolated with desired precision. It is noted that, at each iteration, simulations and checks of design constraints may be limited to those chip locations that have failed on some sampled variation points, so as to significantly reduce the computational cost, especially when failure locations are sparsely distributed. At last, variation points on the boundary of yield, or even some points out of the boundary, may be associated with reports of failure locations in the chip design, or places on the verge of failures, together with design constraints violated therein. If further a probability distribution is known for the process variations, then integrating the probability over the yield-OK process region gives an estimation of yield with respect to the design constraints. Such reports of predicted process problems and estimated yield could help considerations of design-for-manufacturing and design-for-yield. A calculated boundary of yield with associated reports are preferably used to guide yield enhancement and optimization by optimizing lithographic processes and OPC of masks.

Figure 3:
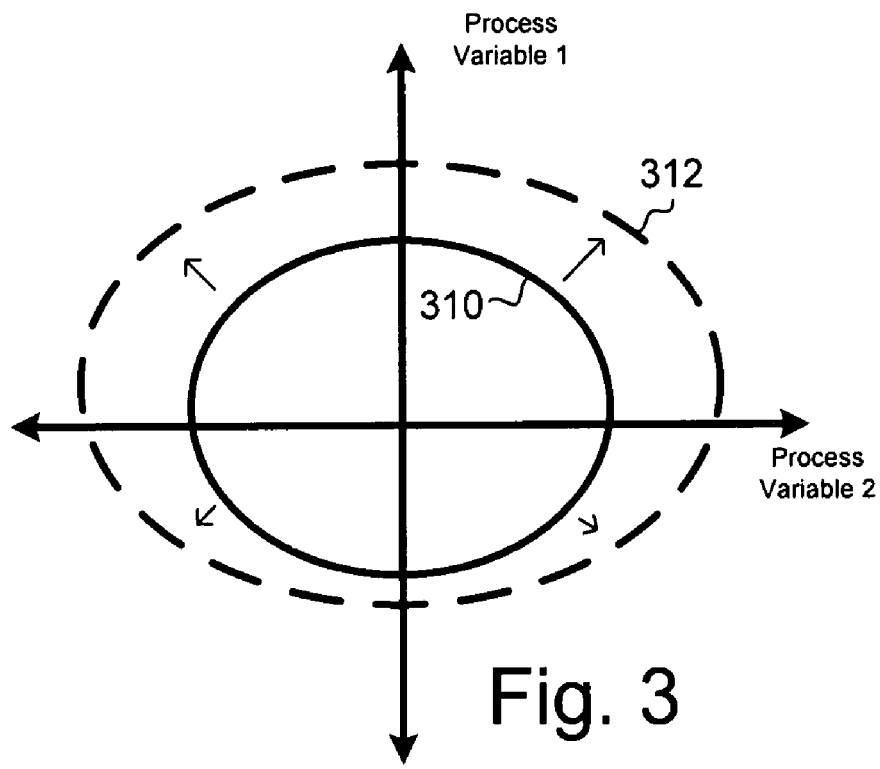
FIG. 3 illustrates yield enhancement and optimization through calculated boundary of yield, according to an embodiment.

FIG. 3 illustrates yield enhancement and optimization through calculated boundary of yield, according to an embodiment. Boundary of yield curve 310 is initially calculated to suitable precision according to the iterative approach described above. Through a process/OPC modification, a new boundary of yield curve 312 is obtained that covers a larger area of the process variable space or accumulates more probability of process variations. Since the modified process/OPC modification covers more yield probability, it is accepted as an improvement.

Figure 4:
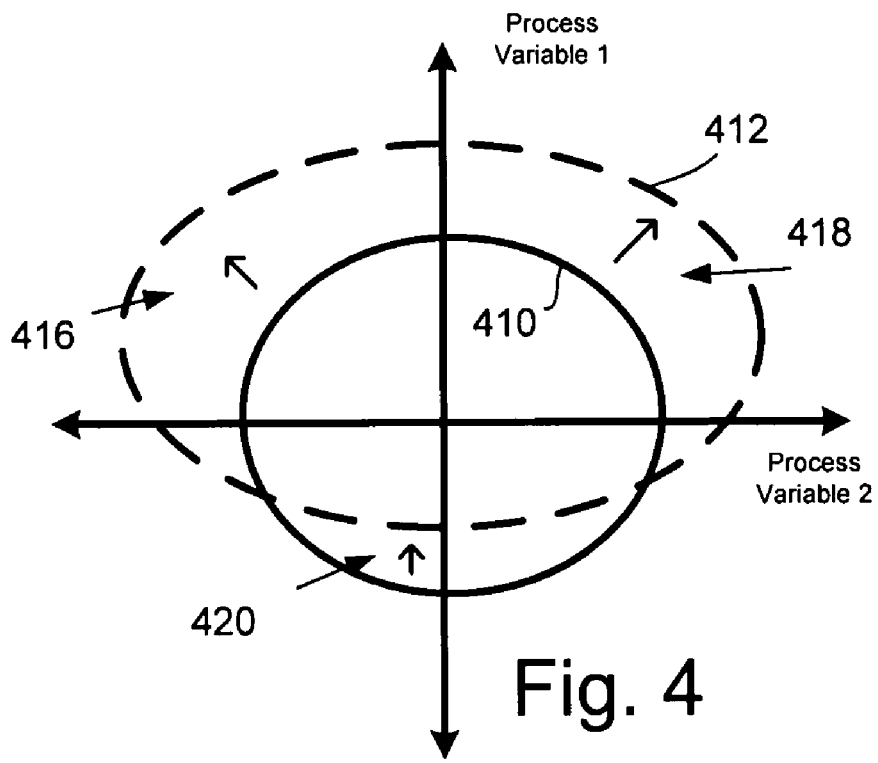
FIG. 4 illustrates yield enhancement and optimization through calculated boundary of yield, according to another embodiment.

FIG. 4 illustrates yield enhancement and optimization through calculated boundary of yield, according to another embodiment. Initial boundary of yield curve 410 is calculated to suitable precision as described. Through a process/OPC modification, a new boundary of yield curve 412 is obtained. In this example, in some regions having a relatively high probability density, such as areas 416 and 418, the boundary of yield is pulled outward to cover more yield probability, while other regions having a relatively low probability density, such as area 420, may be sacrificed, where the boundary of yield may be shrunk inward. According to this embodiment, the admittance of a process/OPC modification preferably depends on whether the yield probability gets a positive increment as the net result.

Figure 5:
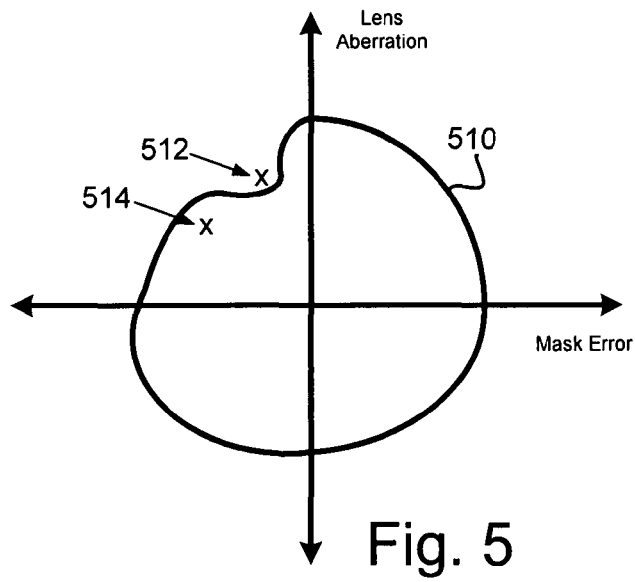
FIG. 5 illustrates an example of a process window or boundary of yield, according to an embodiment.

FIG. 5 illustrates an example of a process window or boundary of yield, according to an embodiment. FIG. 5 illustrates a two-dimensional process variable space, where on the vertical axis is lens aberration, and on the horizontal axis is mask error. Note that boundary curve 510 has a concave section around condition point 512, such that condition 512 fails some of given constraints at some locations in the chip design, and condition 514 passes the given constraints. In the example of FIG. 5, it may be desirable to take a closer look at the failed locations in the chip design in the region of process variable space around condition 512.

Figure 6:
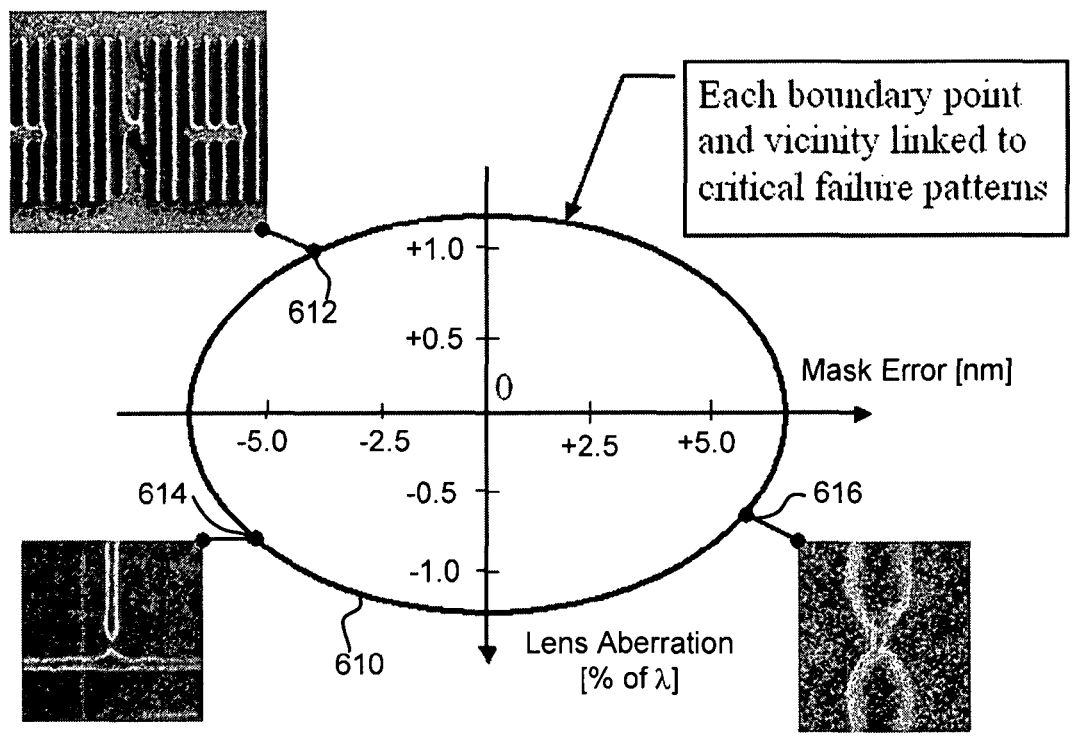
FIG. 6 illustrates an example of a process window or boundary of yield according to another embodiment.

FIG. 6 illustrates an example of a process window or our boundary of yield according to another embodiment. FIG. 6 illustrates the capability to associate or link points on the boundary of yield to different types of critical failure patterns. In this example, there are three points 612, 614 and 616 on process window curve 610. Each of the points is linked to a different type of critical failure patter as shown.

Figure 7:
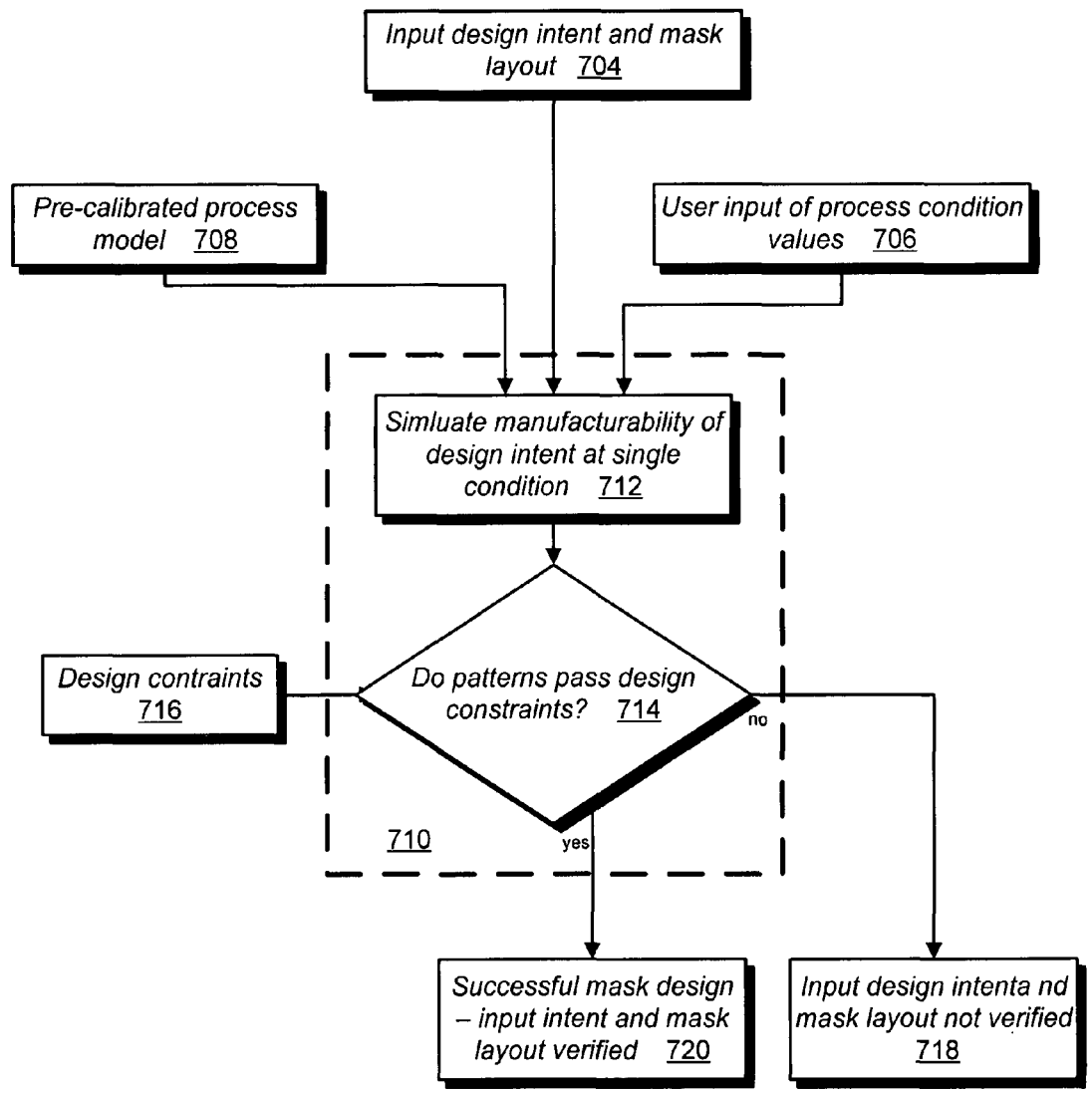
FIG. 7 is a flow chart illustrating steps in carrying out lithography verification at single process condition in a fab setting, according to embodiments.

FIG. 7 is a flow chart illustrating steps in carrying out lithography verification at single process condition in a fab setting, according to embodiments. As used herein, the term "process condition" or "condition" refers to a setting of a collection or vector of process variables, and a "process condition value" or "condition value" refers to a collection or vector of numerical values, with each numerical value corresponding to each process variable, and each process variable in turn characterizing each process variation under consideration. For example, in a three-dimensional process variable space, each process condition is represented by a single process condition value having three numerical components, which corresponds to a single point in the three-dimensional space. In step 704, a layout of design intent and a layout of mask are received and input to photolithography simulator 710. The design intent and mask layout of step 704 preferably will be used to produce the intended wafer patterns. In step 708, a pre-calibrated process model is input into the photolithography simulator 710. As used herein, the term "pre-calibrated process model" refers to a computer model of a lithography process that is trained or calibrated using the layout of a known mask and measured data from a printed wafer using said known mask and said lithography process. In step 706, the user, which may be for example a fab engineer doing the lithography verification, inputs the process variable values for a single condition. That is, for each process variation, there is a single value for the corresponding process variable. In step 716, design constraints, such as a set of design rules that specify constraints on the wafer patterns, are also input into photolithography simulator 710. In step 712, the manufacturability of the design intent is simulated at the single process condition. Computer simulations are carried out using the pre-calibrated process model, to predict the wafer patterns. In step 714, the simulated wafer patterns are checked against the design constraints. In step 718, if the wafer patterns do not pass, the output is that the mask layout is "not verified." In step 720, if the predicted wafer patterns pass the design constraints, then the output is a "successful mask design."

Figure 8:
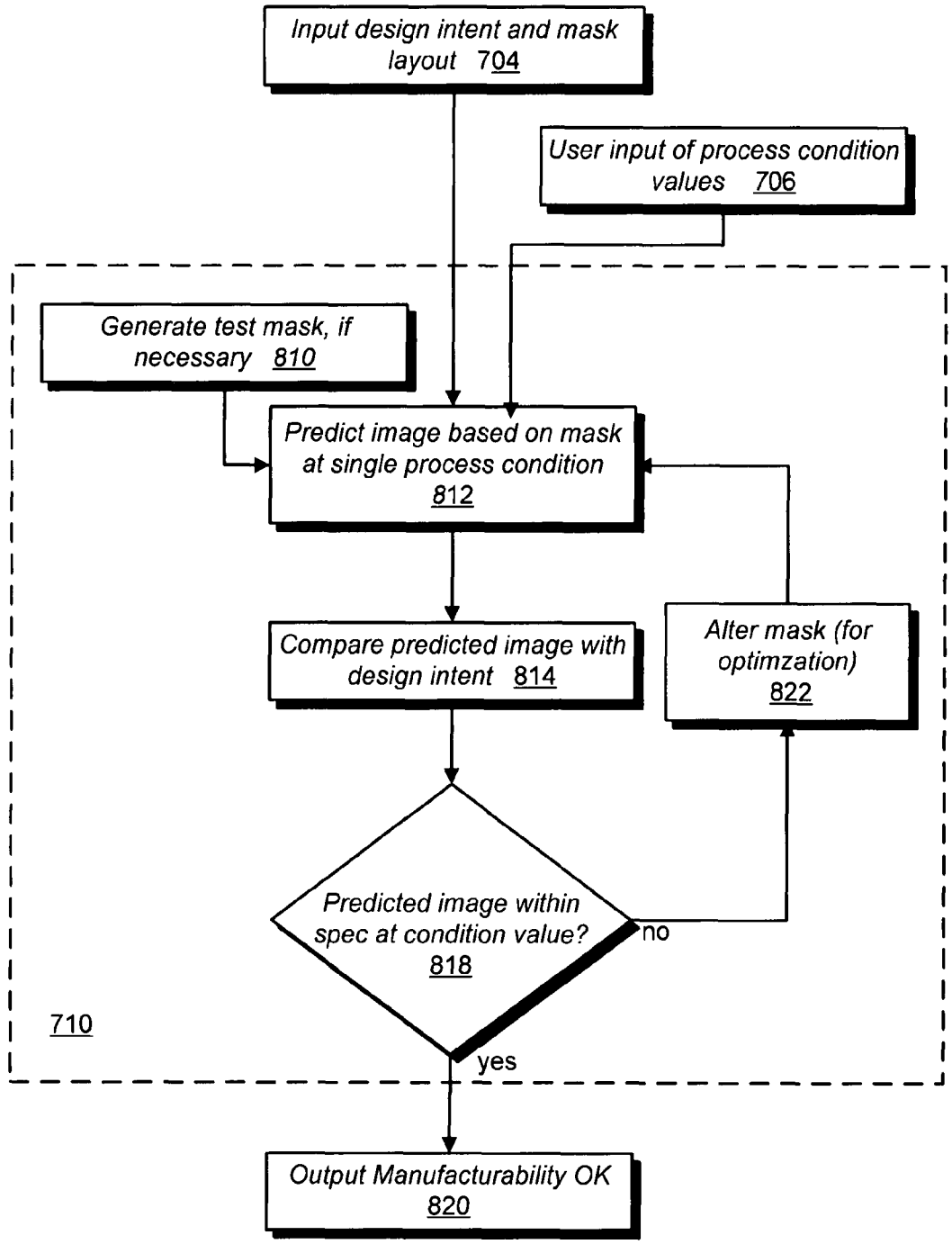
FIG. 8 is a flow chart illustrating further details in carrying out lithography verification at single process condition in a fab setting, according to embodiments.

FIG. 8 is a flow chart illustrating further details in carrying out lithography verification at single process condition in a fab setting, according to embodiments. In steps 704 and 706, the design intent, mask layout, and process condition values are input to photolithography simulator 710 as described in connection with FIG. 7. In step 810, a test mask is generated if there was no mask layout input in step 704. In step 812 the wafer patterns are predicted based on the mask at the single process condition. Preferably, the method and system for computer simulation of photolithography used in photolithography simulator 710 is as described in co-pending application U.S. Ser. No. 11/795,808, filed Feb. 12, 2007, which is a continuation of U.S. Ser. No. 11/331,223, filed Jan. 11, 2006, now abandoned, and in co-pending application U.S. Ser. No. 11/708,444, which is being filed on the same day as the present application. The computer simulations of step 812 preferably generate and use image intensities at more than one depth in the photoresist. This is in contrast to the conventional methods, which in general do not calculate more than one image at different depths in the photoresist layer. According to a preferred embodiment, in simulation step 812, multiple image intensities at more than one depth in the photoresist are combined nonlinearly, and the resulted effective image intensity is used to predict the wafer patterns. Advantageously, by taking full consideration of 3D and nonlinear photoresist effects, the capability to obtain high simulation accuracy is provided. In step 814, the predicted image is compared with the design intent. If the predicted image is within the spec, i.e. the design constraints, in step 818, control is passed to step 820, which outputs that the manufacturability is "OK". If the predicted image is not within spec, then in the case of lithography verification, the output in step 820 is manufacturability "failed." According to another embodiment, optimization of the mask can be undertaken if the predicted image is not within spec. In this embodiment, in step 822 the mask is altered so as to improve the chip manufacturability. If the improved mask passes the design constraints, then the improved mask is outputted in step 820. According to yet another embodiment, in the case where the wafer patterns do not pass the design constraints, the intended and simulated wafer patterns responsible for the constraint violations are identified. Thus, the lithography simulator according to these embodiments make it possible to do lithography verification for a whole chip, or a relatively large chip area, and to take full consideration of 3D and nonlinear resist effects, which provides improved simulation accuracy, and separates the chemical step of resist development from the optical step of image projection.

Figure 9:
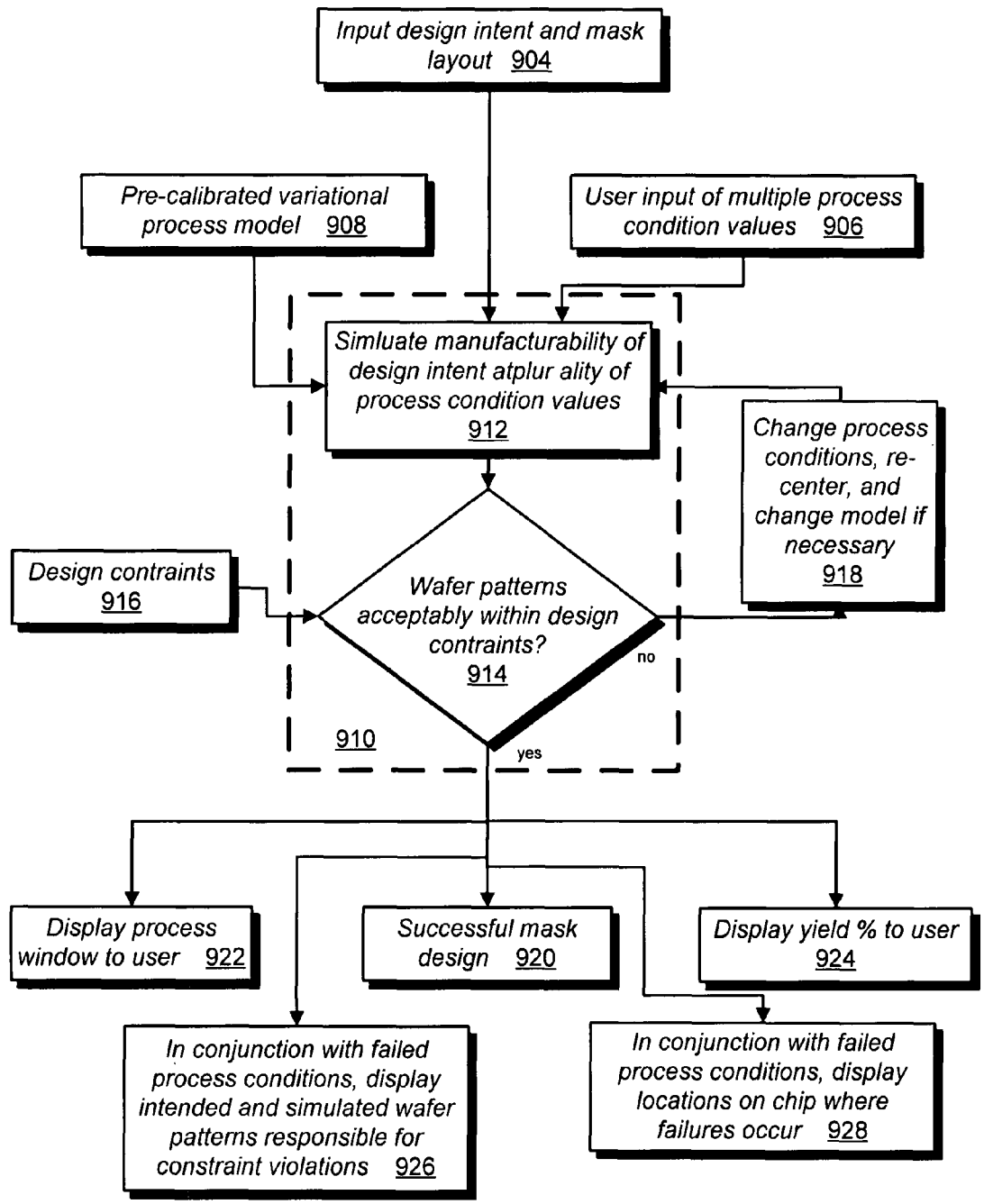
FIG. 9 is a flow chart illustrating steps in carrying out lithography verification at multiple process conditions in a fab setting, according to embodiments.

FIG. 9 is a flow chart illustrating steps in carrying out lithography verification at multiple process conditions in a fab setting, according to embodiments. In step 904, a layout of design intent and a layout of mask are received and input to photolithography simulator 910. The design intent and mask layout of step 904 preferably will be used to produce the intended wafer patterns. In step 908, a pre-calibrated variational process model is input into the photolithography simulator 910. In step 906, the user, which may be for example a fab engineer doing the lithography verification, inputs the process variable values for a multiple process conditions. The multiple process conditions can be input as a list of process variations and ranges of such process variations (for process-window-constrained verification), and probability distribution of such process variations (for yield-constrained verification). In step 916, design constraints such as a set of design rules that specify constraints on the wafer patterns are also input into photolithography simulator 910. In step 912, the manufacturability of the design intent is simulated at the plurality of process conditions. Computer simulations are carried out using the pre-calibrated process model to predict the varying wafer patterns as would be printed under different process conditions. In step 914, the simulated wafer patterns are checked against the design constraints. In step 920, the results of the check at step 914 are reported as a simple yes/no for the given mask design. Alternatively, in step 922, marks of yes/no that constraint violations are passed are given over the given ranges of process variations, namely, over the whole hyperspace of process variations, with the process conditions marked by "yes" constitute a process window (for process-window-constrained verification). Alternatively, selected process conditions may be displayed to signify the boundary of yield as a curve, surface, or hyper-surface, which encloses the process window in a hyperspace of process variations. For example, in step 922, the process window is preferably displayed to the user showing where on the process variable space the design has passed, and where it has failed some of the constraints. According to a further embodiment, in step 928, the locations on the chip where constraint violations occurred in conjunction with process conditions that induce constraint violations are displayed to the user. According to yet a further embodiment, in step 926, the intended and simulated wafer patterns responsible for the constraint violations are displayed to the user. According to yet a further embodiment, in step 924, the report may be an estimated yield percentage or a yes/no that a target yield value is reached.

According to another embodiment, in step 918, if some of the wafer patterns do not pass, the process conditions are changed so as to improve the manufacturability of the wafer patterns. In step 918, the process variable space may be "re-centered" if it is found that adjusting the process variable range or ranges improves the manufacturability of the design intent using the mask layout. The pre-calibrated model may also be changed if the process condition change makes it necessary.

Figure 10:
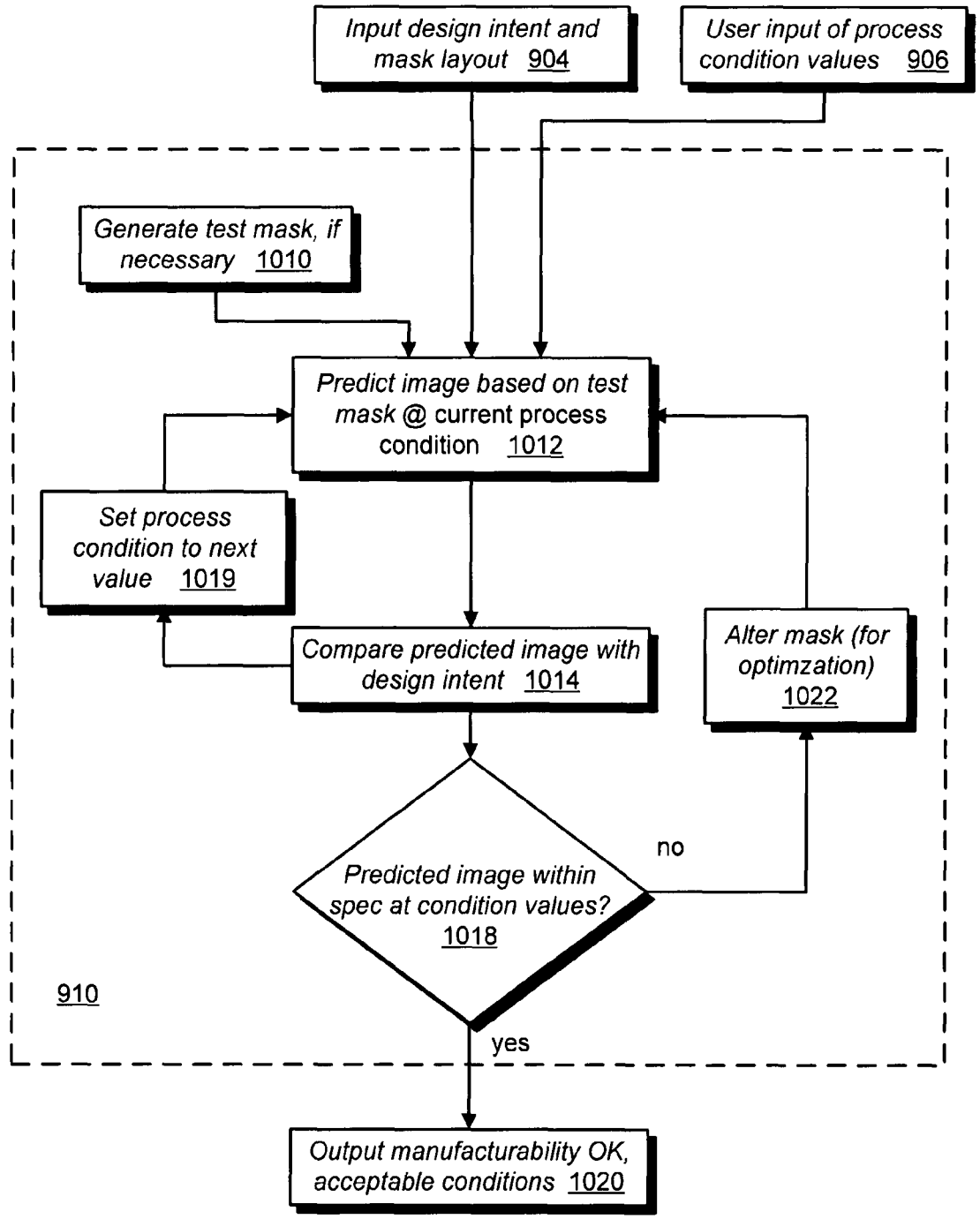
FIG. 10 is a flow chart illustrating further details in carrying out lithography verification at multiple process conditions in a fab setting, according to embodiments.

FIG. 10 is a flow chart illustrating further details in carrying out lithography verification at multiple process conditions in a fab setting, according to embodiments. In steps 904 and 906, the design intent, mask layout, and the various process conditions are input to photolithography simulator 910 as described in connection with FIG. 9. In step 1010, a test mask is generated if there was no mask layout input in step 904. In step 1012 the wafer patterns are predicted based on the mask at an initial process condition. Preferably, the method and system for computer simulation of photolithography used in photolithography simulator 910 is as described in co-pending application U.S. Ser. No. 11/795,808, filed Feb. 12, 2007, which is a continuation of U.S. Ser. No. 11/331,223, filed Jan. 11, 2006, now abandoned, and in co-pending application U.S. Ser. No. 11/708,444, which is being filed on the same day as the present application. The computer simulations of step 1012 preferably generate and use image intensities at more than one depth in the photoresist. This is in contrast to the conventional methods, which in general do not calculate more than one image at different depths in the photoresist layer. According to a preferred embodiment, in simulation step 1012, multiple image intensities at more than one depth in the photoresist are combined nonlinearly, and the resulted effective image intensity is used to predict the wafer patterns. Advantageously, by taking full consideration of 3D and nonlinear photoresist effects, the capability to obtain high simulation accuracy is provided. In step 1014, the predicted image is compared with the design intent. In step 1019, the process condition is set to the next value, namely, the vector of process variables is set to the next vector of numerical values, and then step 1012 is repeated. Steps 1012, 1014, and 1019 are repeated so that the simulation and comparison are performed for all of the required by the input process conditions. Once all of the process conditions as required by the input process conditions are simulated and checked, in step 1018 a decision is made based on the results of the comparisons. According to one embodiment, if any of the process conditions passes the design constraints, then in step 1020 the output is manufacturability "OK" at each passing condition. According to another embodiment, an optimization step takes place if any of the process conditions fail some of the constraints. In this embodiment, the control passes to step 1022 where the mask is altered in order to optimize the mask for improved manufacturability. According to yet another embodiment, a predetermined threshold is used to determine if the input design or mask layout are considered manufacturability "OK". For example, this threshold could be a preset percentage of conditions, or a preset subset of conditions, or it may be a preset accumulative probability accumulated over passing process conditions, when process conditions are probability-weighted depending on the probability weights of the process variations. According to yet another embodiment, in the case where the wafer patterns do not pass the design constraints, the intended and simulated wafer patterns responsible for the constraint violations are identified. Thus, the lithography simulations according to these embodiments provide the capability to do lithography verification for a whole chip (or at least a large chip area), and to take consideration of multiple process variations. The preferred simulation techniques avoid not only repeated simulations, but also repeated construction of model kernels, which are mathematical functions characterizing the photolithographic process and being used for simulating such photolithographic process. Lithography verification using process variation simulations improves the robustness of chip manufacturing against process variations, and increases the chip yield.

Figure 11:
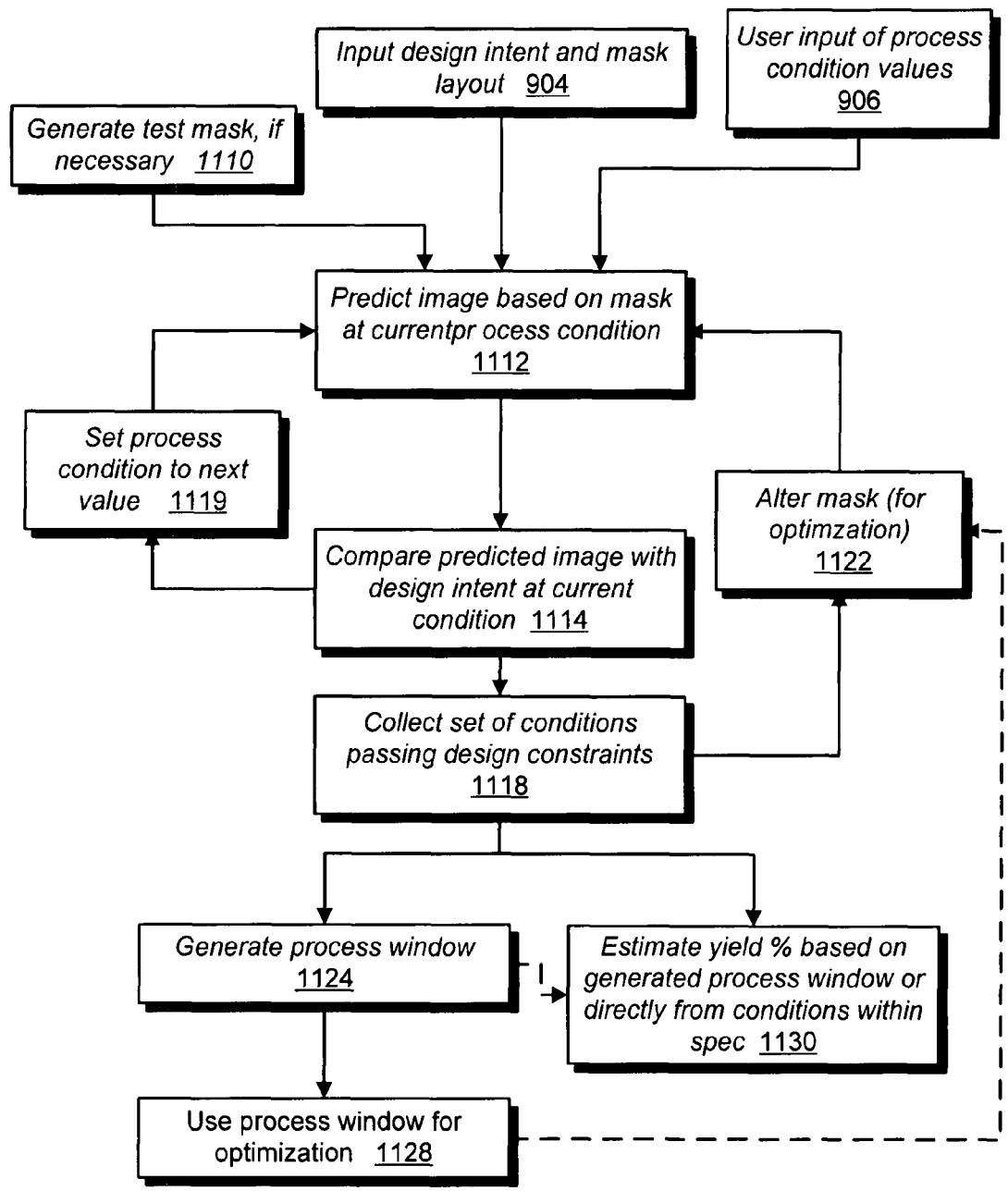
FIG. 11 is a flow chart illustrating further details in estimating a process window and yield, and carrying out optimization in a fab setting, according to embodiments.

FIG. 11 is a flow chart illustrating further details in estimating a process window and yield, and carrying out optimization in a fab setting, according to embodiments. In steps 904 and 906 the design intent, mask layout, and the various process conditions are input to photolithography simulator 910 as described in connection with FIG. 9. For yield estimation, the process conditions input in step 906 preferably include the probability distribution of process variations. In step 1110, a test mask is generated if there is no mask layout input in step 904. In step 1112 the wafer patterns are predicted based on the mask at an initial process condition. Preferably, the method and system for computer simulation of photolithography used in photolithography simulator 910 are as described above. The computer simulations of step 1112 preferably generate and use image intensities at more than one depth in the photoresist. This is in contrast to the conventional methods, which in general do not calculate more than one image at different depths in the photoresist layer. According to a preferred embodiment, in simulation step 1112, multiple image intensities at more than one depth in the photoresist are combined nonlinearly, and the resulted effective image intensity is used to predict the wafer patterns. Advantageously, by taking full consideration of 3D and nonlinear photoresist effects, the capability to obtain high simulation accuracy is provided. In step 1114, the predicted image is compared with the design intent. In step 1119, the process condition is set to the next process condition value, and then step 1112 is repeated. Steps 1112, 1114, and 1119 are repeated so that the simulation and comparison are performed for all of the process conditions as required by the input process conditions. In step 1118, the conditions at which the design constraints are satisfied are collected. In step 1124, the boundary between yield-OK and yield-loss regions is determined in a hyperspace of process variations (the region enclosed by such boundary is called a hyper process window, or simply process window). The output may be the boundary of yield (equivalently, the process window). According to a further embodiment, the output of step 1124 are selected process variation points on the boundary of yield, the points being associated with reports of failure locations in the design, or places on the verge of failures, together with design constraints violated therein. According to a further embodiment, the output step 1124 can display selected process variation points on the boundary with each point and/or vicinity linked to a collection of critical failure patterns such as shown and described in connection with FIG. 6. In step 1130, the yield can be calculated from the process window generated in step 1124, or alternatively it can be calculated directly from the set of conditions having the design constraints passed. The probability distribution is preferably known for the process variations, thereby allowing an integration of the probability over the process window resulting in an estimation of yield with respect to the design constraints. Thus, the embodiments described herein advantageously can provide the user with knowledge of hyper process window (equivalently, boundary of yield) which may be used to guide lithography verification and process optimization to improve the robustness of chip manufacturing against process variations, or to increase the chip yield.

In steps 1122 and 1128, the mask is iteratively revised until a halting criterion (for example, no design constraint violation, or sufficient process window, or sufficient yield, or simply a maximum number of iterations) is reached. The OPC/RET corrections are preferably optimized, by maximizing the yield probability or process window for a specific intended pattern, or a set of intended patterns, or the union of all patterns of a cell or a chip. To reduce the computational complexity, one or several point(s) are preferably identified on the boundary of a given process window that are associated with a high probability density, then optimizing the OPC/RET corrections by "pushing" the boundary outward to enclose more area, volume, or hyper-volume around the identified points of process variations, or "pushing" the boundary outward and further away from the identified points, while regions around boundary points that are associated with a lower probability density may be sacrificed, namely, having the boundary of yield shrunk inward, so long as the net result of the OPC/RET corrections induces a positive increment of yield probability. The algorithm is preferably run iteratively so as to eventually maximize the desired process window, for example in the sense of maximizing the yield probability integrated over the process window. This embodiment advantageously provides optimization under process variations so as to render the wafer patterns less sensitive to process variations or improved yield.

Figure 12:
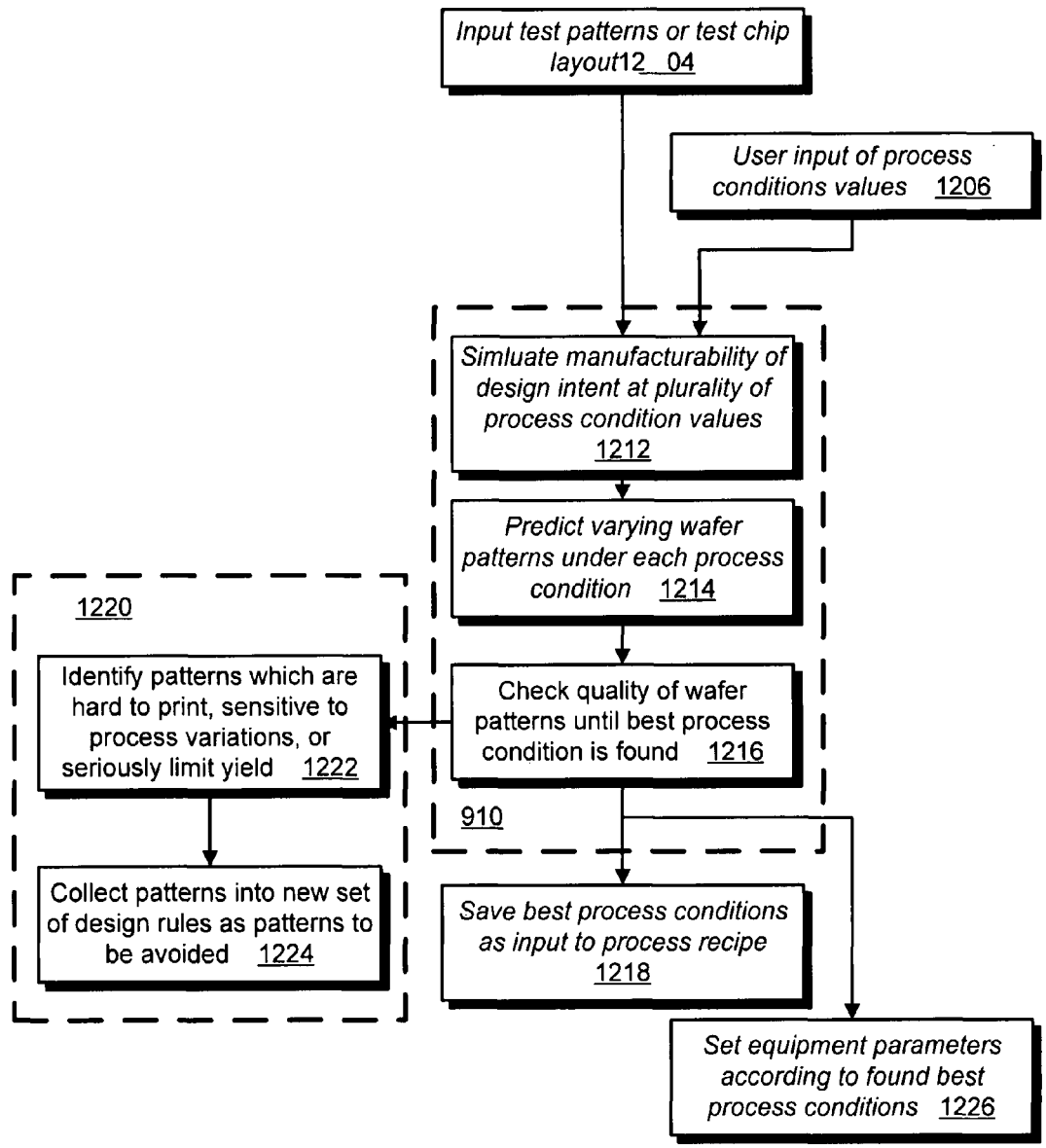
FIG. 12 is a flow chart illustrating further details in developing process recipes and generating design rules, according to embodiments.

FIG. 12 is a flow chart illustrating further details in developing process recipes and generating design rules, according to embodiments. In step 1204, a test mask consisting of test patterns (possibly part or the whole of an actual chip layout) is input to lithography simulator 910. In step 1206 parameters describing process conditions (that include designs and settings of lithography equipment, materials, physical and chemical recipes, as well as usages and flow sequences of equipments, materials, and process steps) are input to lithography simulator 910. In step 1212, repeated computer simulations are carried out using a first-principle model for various process conditions. In step 1214, the varying wafer patterns as would be printed under different process conditions are predicted. In step 1216, the quality is checked of such wafer patterns, until the best process condition is found, under which all test patterns would be printed with sufficient quality. Alternatively, the quality can be checked until the best process condition is found under which a desired process window is obtained, a process window is maximized, or an estimated yield factor is maximized. In step 1218, the best process conditions are saved as entries to process recipe. This embodiment provides a much faster and less expensive alternative to conventional approaches that rely on extensive trial-and-errors, experience accumulation, actual lab experiments, or human-attention-intensive computer simulations using traditional TCAD tools. In step 1226, the equipment parameters are set according to parameters of best process conditions.

According to another embodiment, a design rule generation method 1220 is provided. In step 1222, bad design intent patterns are identified which are difficult to print, or sensitive to process variations, or seriously limit yield. In step 1224 the patterns are collected into a set of design rules as patterns to be avoided.

Figure 13:
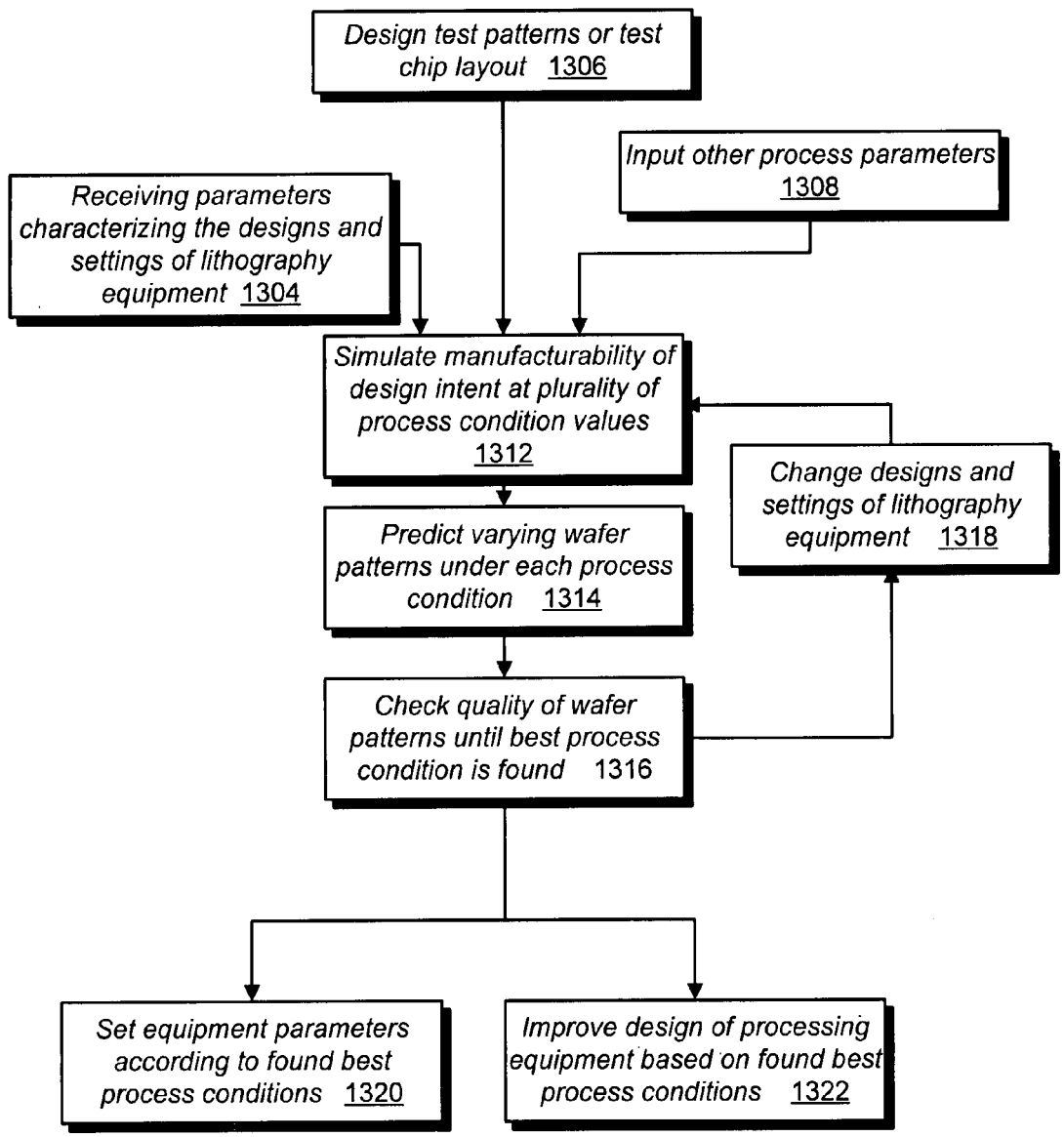
FIG. 13 is a flow chart illustrating further detail in chip-yield-oriented optimization of equipment design and configuration, according to embodiments.

FIG. 13 is a flow chart illustrating further detail in chip-yield-oriented optimization of equipment design and configuration, according to embodiments. In step 1304, parameters are received characterizing the designs and settings of lithography equipments. In step 1308, other process parameters are received to fully describe the process conditions (that include materials, material properties, physical and chemical recipes, as well as usages and flow sequences of equipments, materials, and process steps). In step 1306 a test mask is received consisting of test patterns (possibly part or the whole of an actual chip layout). In step 1312, computer simulations are repeatedly carried out using a first-principle model for various process conditions. In step 1314, the varying wafer patterns are predicted as would be printed under different process conditions. In step 1316, the quality of such wafer patterns is checked, until the best process condition is found, under which all test patterns would be printed with sufficient quality. Alternatively, the quality can be checked until the best process condition is found under which a desired process window is obtained, a process window is maximized, or an estimated yield factor is maximized. In step 1318, lithography equipment designs are changed, along with settings. For example, for an optical exposure system, the illumination source configuration can be changed, or the lens design may be slightly altered. The steps of 1312, 1314, 1316, and 1318 are repeated, until designs and settings of equipments are optimized, and other process conditions are best set, so that all test patterns would be printed with sufficient quality. In step 1320, the equipment parameters are set according to parameters of best process conditions. In step 1322, the optimized equipment designs are used in the equipment. Thus, the described embodiment of simulation-based and chip-yield-oriented optimization of equipment design and configuration provides a faster and less expensive alternative to conventional methods that rely on extensive trial-and-errors, experience accumulation, actual lab experiments, or human-attention-intensive computer simulations using traditional TCAD tools.

According to another embodiment, a technique of calibrating a software model is provided. Using a test mask consisting of test patterns (possibly part or the whole of an actual chip layout) and measured data from a printed wafer using the test mask and a lithography process to be calibrated, repeated computer simulations are carried out under various process conditions, to predict the varying wafer patterns as would be printed under different process conditions, and compare the predict wafer patterns with said measured data, until the best process condition is found to minimize the difference. This embodiment provides a faster alternative to conventional methods that rely on extensive experience, trial-and-errors and human-attention-intensive computer simulations. The calibrated model is more accurate, and extendable to support process variation simulations under conditions that are far from that/those used to generate the actual wafer patterns and measured data.

According to another embodiment, referred to as Chip-Specific Process Optimization (CSPO) or Application-Specific Process Optimization (ASPO), a layout of a designed circuit, namely, a specific application, is subject to a simulation-based manufacturability check, using a pre-calibrated variational process model, where many process parameters, such as illumination source configuration, N.A. (numerical aperture) of projection lens, lens aberrations and their trade-offs, thickness and indices of thin-films on wafer, OPC, PSM, and assist features of masks, etc., can be varied, simulated, thus optimized with respect to the given specific chip to be manufactured, in order to truly maximize the yield of that chip in question. The optimization objectives may be to print wafer patterns closest to the indent, to yield the chip over maximized process window, to achieve best yield, or to minimize the mask complexity and cost. This embodiment advantageously provides an alternative to conventional process development techniques that use a limited set of test patterns, where it is a difficult task to optimize the test patterns achieving good correlation with a given layout of a designed chip, and a process optimized under the guidance of a set of test patterns is only sub-optimal for a specific application. By contrast, the current embodiment provides the capability for enhanced optimality of process parameters to manufacture the given chip, as opposed to sub-optimality using test patterns that are not well correlated to the specific chip. Importantly, the first-principle variational model supports variability of the complete set of relevant process parameters, and ties such process parameters directly to model parameters. Furthermore, the provided tool is accurate to truly represent the process and fast to simulate over a large area.

Figure 14:
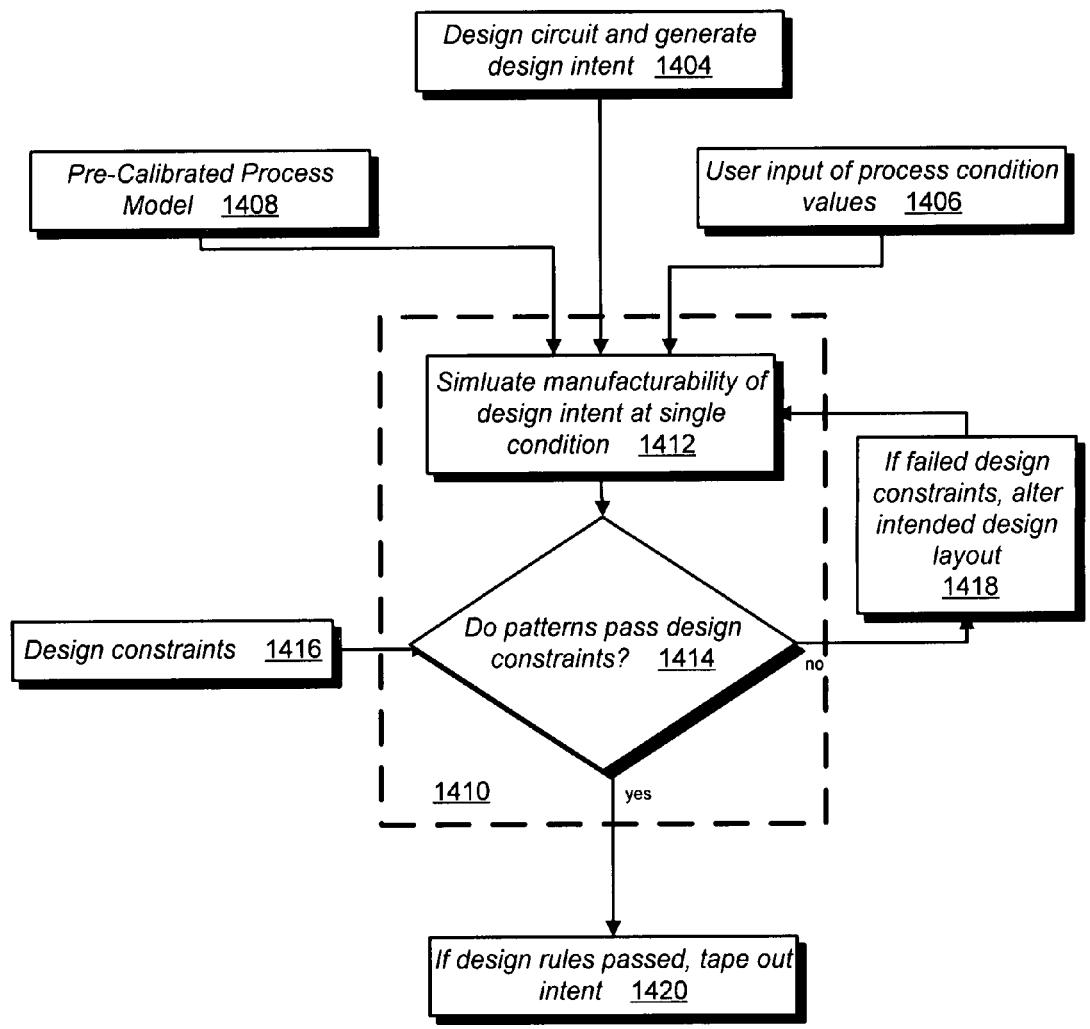
FIG. 14 is a flow chart illustrating steps in carrying out lithography verification at single process condition in a design setting, according to embodiments.

FIG. 14 is a flow chart illustrating steps in carrying out lithography verification at single process condition in a design setting, according to embodiments. In step 1404, a layout of design intent is created by the designer and input to photolithography simulator 1410. In step 1408, a pre-calibrated process model is input into the photolithography simulator 1410. In step 1406, the user inputs the process variable values for a single condition. The process variable values could either be selected by the user or in some cases they could be specified or recommended by the fab. In step 1416, design constraints such as a set of design rules that specify constraints on the wafer patterns are also input into photolithography simulator 1410. In step 1412, the manufacturability of the design intent is simulated at the single process condition. Computer simulations are carried out using the pre-calibrated process model, to predict the wafer patterns. In step 1414, the simulated wafer patterns are checked against the design constraints. In step 1418, if the wafer patterns do not pass some of the design constraints, the intended design is changed, so as to improve the manufacturability of the wafer patterns. Changing the intended design layout, which will for example involve re-routing of some of the circuit or layout elements, is to be distinguished from simply changing the shape of some of the layout elements. The step 1418 can be carried out by the designer, or according to some embodiments, automated through the software. In step 1420, if the predicted wafer patterns pass the design constraints, then intended design can be "taped out".

Figure 15:
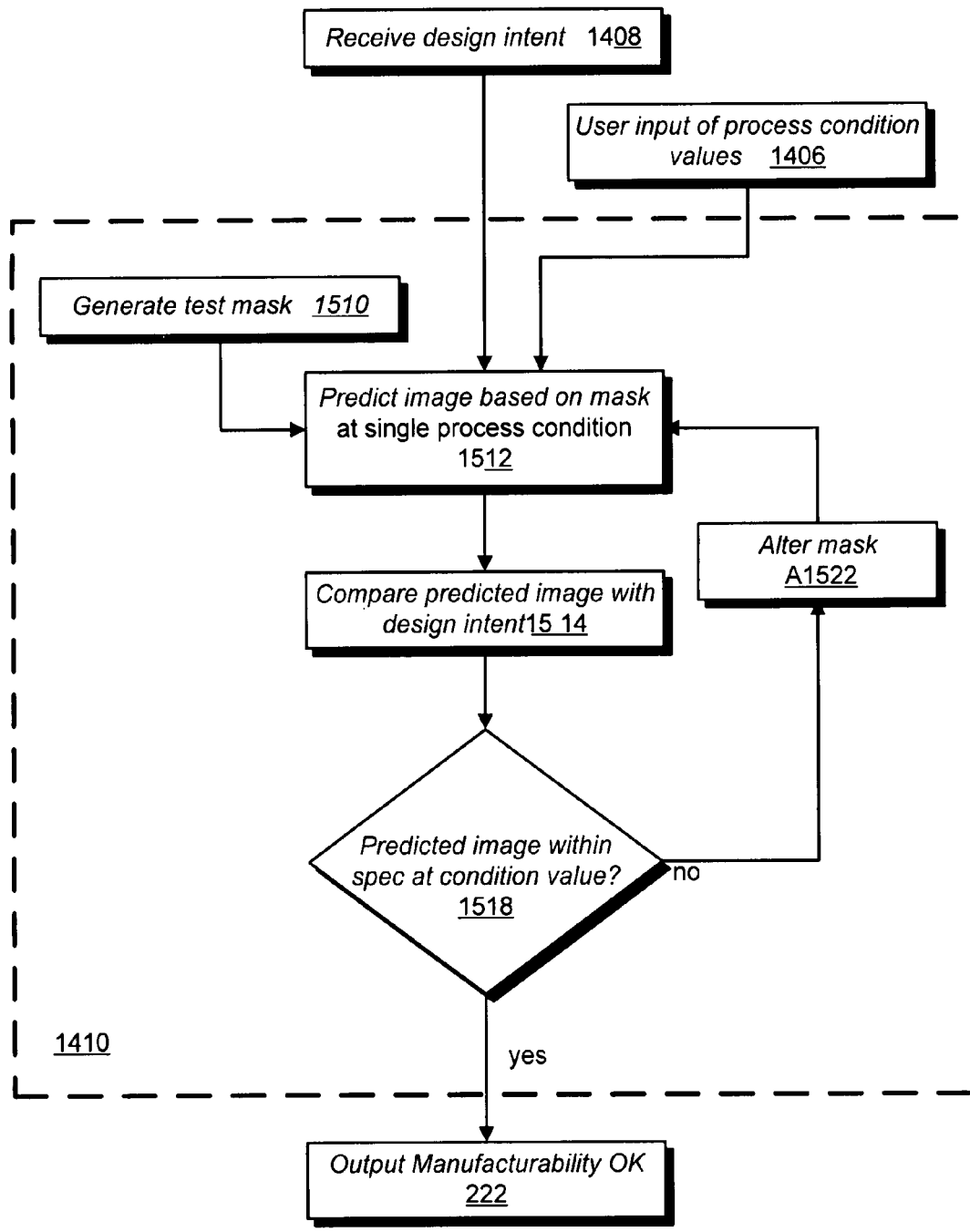
FIG. 15 is a flow chart illustrating further details in carrying out lithography verification at single process condition in a design setting, according to embodiments.

FIG. 15 is a flow chart illustrating further details in carrying out lithography verification at single process condition in a design setting, according to embodiments. In steps 1404 and 1406 the input design intent, and process condition values are input to photolithography simulator 1410 as described in connection with FIG. 14. In step 1510, a test mask is generated. In step 1512 the wafer patterns are predicted based on the mask at the single process condition. Preferably, the method and system for computer simulation of photolithography used in photolithography simulator 1410 is as described in the co-pending application U.S. Ser. No. 11/795,808, filed Feb. 12, 2007, which is a continuation of U.S. Ser. No. 11/331,223, filed Jan. 11, 2006, now abandoned, and in co-pending application U.S. Ser. No. 11/708,444, which is being filed on the same day as the present application. The computer simulations of step 1512 preferably generate and use image intensities at more than one depth in the photoresist. This is in contrast to the conventional methods which in general does not take depth of the resist layer into consideration. According to a preferred embodiment, in simulation step 1512, multiple image intensities at more than one depth in the resist are combined nonlinearly, and the resulted effective image intensity is used to predict the wafer patterns. In step 1514, the predicted image is compared with the design intent. If the predicted image is within the spec, i.e. the design constraints, in step 1518, control is passed to step 1520, which outputs that the manufacturability is "OK". If the predicted image is not within spec, in step 1522 the mask is altered so as to improve its manufacturability. If the improved mask passes the design constraints, then control is passed to step 1520 which outputs that the manufacturability is "OK". According to yet another embodiment, in the case where the wafer patterns do not pass the design constraints, the intended patterns responsible for the constraint violations are identified. Thus, the lithography simulator according to these embodiment make it possible to do lithography verification for a whole chip, or a relatively large chip area, and to take full consideration of 3D and nonlinear photoresist effects, which provides improved simulation accuracy and to separate the chemical step of resist development from the optical step of image projection. In general, the steps shown in FIGS. 14 and 15 are analogous to those if FIGS. 7 and 8, except that the inner steps shown in FIG. 15 are preferably hidden from the designer, who simply provides a design intent and gets the lithography verification report.

Figure 16:
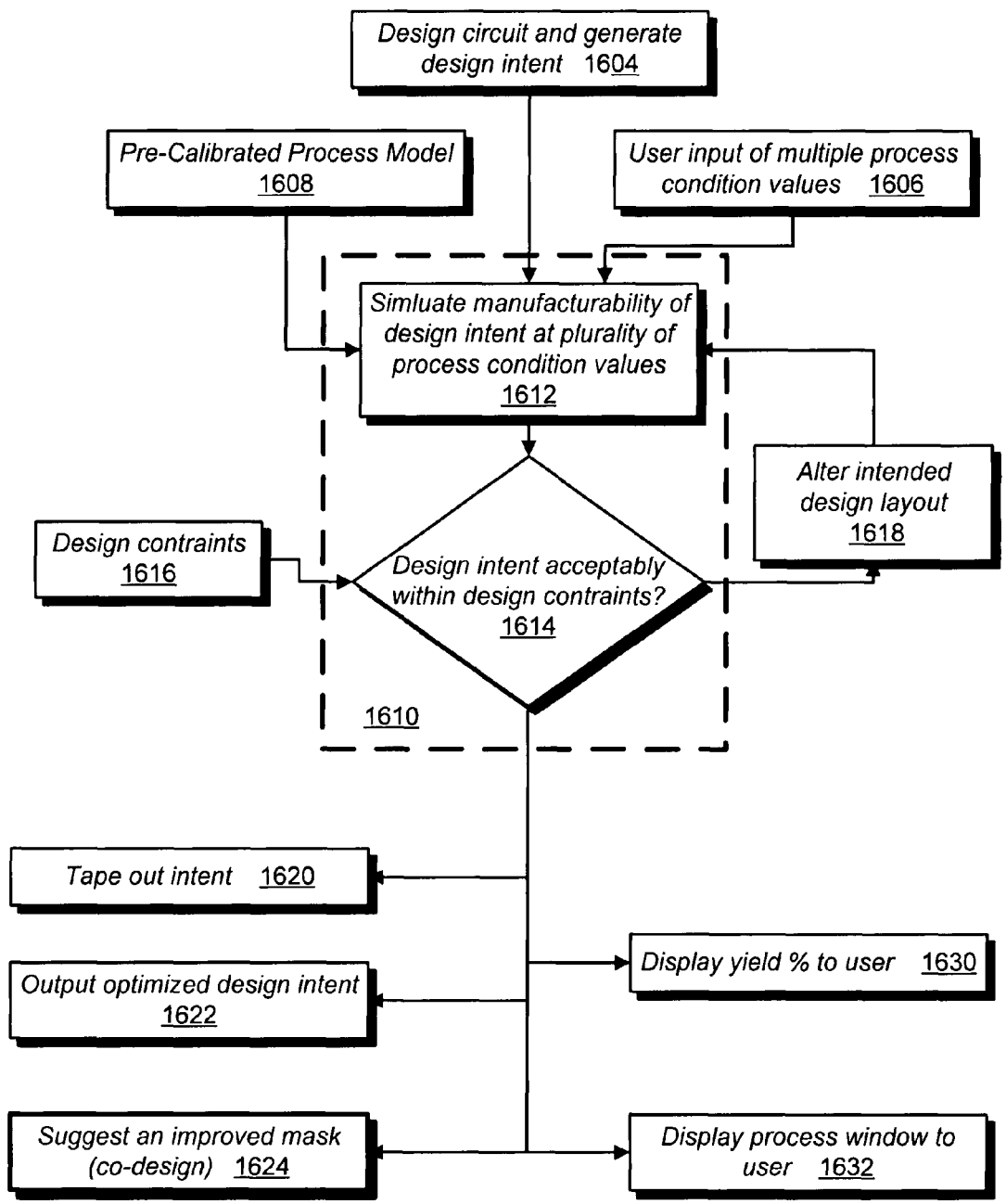
FIG. 16 is a flow chart illustrating steps in carrying out lithography verification at multiple process conditions in a design setting, according to embodiments

FIG. 16 is a flow chart illustrating steps in carrying out lithography verification at multiple process conditions in a design setting, according to embodiments. In step 1604, the circuit is designed and the design intent is generated. In step 1608, a pre-calibrated variational process model is input into photolithography simulator 1610. In step 1606, the user inputs the process variable values for a multiple process conditions. The multiple process conditions can be input as a list of process variations and ranges of such process variations (for process-window-constrained verification) or a probability distribution of such process variations (for yield-constrained verification). In step 1616, design constraints such as a set of design rules that specify constraints on the wafer patterns are also input into photolithography simulator 1610. In step 1612, the manufacturability of the design intent is simulated at the plurality of process conditions. Computer simulations are carried out using the pre-calibrated process model to predict the varying wafer patterns as would be printed under different process conditions. In step 1614, the simulated wafer patterns are checked against the design constraints. In step 1620, the results of the check at step 1614 are reported as a simple yes/no for the given design intent. Alternatively, in step 1618, if report is not satisfying, re-route the design or change the design intent for more than one layer; and repeat steps 1612, 1614 and 1618 until satisfying report is obtained. The re-routing can be done by the designer, or can be performed as part of an automated optimization.

If the design intend has been optimized, then in step 1622, it is output. Alternatively, in step 1624, as a result of the generation of an improved or optimized test mask as later described in FIG. 17, the improved mask is suggested to the user in step 1624. In step 1630, an estimated yield % is displayed to the user. In step 1632 a process window or boundary of yield is displayed to the user, for example in the process variation space. Violations may be given over the given ranges of process variations, namely, over the whole hyperspace process window (for process-window-constrained verification). For example, in step 1632, the process window is preferably displayed to the user showing where on the space the design has passed, and where it has failed the constraints. According to a further embodiment, the locations on the chip where constraint violations occurred are displayed to the user. According to yet a further embodiment, the intended and simulated wafer patterns responsible for the constraint violations are displayed to the user.

Figure 17:
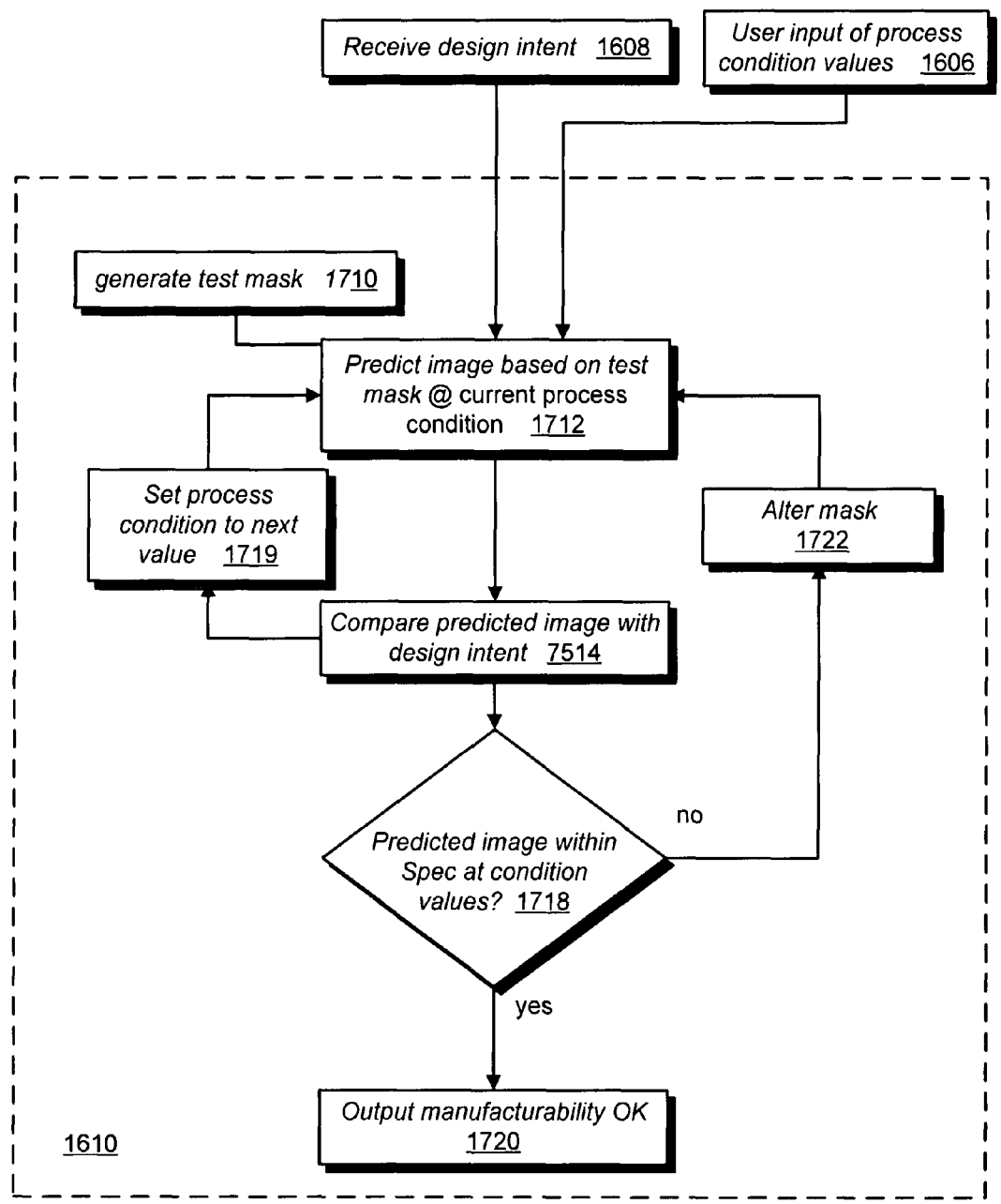
FIG. 17 is a flow chart illustrating further details in carrying out lithography verification at multiple process conditions in a design setting, according to embodiments.

FIG. 17 is a flow chart illustrating further details in carrying out lithography verification at multiple process conditions in a design setting, according to embodiments. In steps 1604 and 1606 the input design intent, and the various process conditions are input to photolithography simulator 1610 as described in connection with FIG. 16. In step 1710, a test mask is generated. In step 1712 the wafer patterns are predicted based on the mask at an initial process condition. Preferably, the method and system for computer simulation of photolithography used in photolithography simulator 1610 is as described above. The computer simulations of step 1712 preferably generate and use image intensities at more than one depth in the photoresist. According to a preferred embodiment, in simulation step 1712, multiple image intensities at more than one depth in the resist are combined nonlinearly, and the resulted effective image intensity is used to predict the wafer patterns. In step 1714, the predicted image is compared with the design intent. In step 1719, the process variables are set to the next condition values, and then step 1712 is repeated. Steps 1712, 1714 and 1719 are repeated so that the simulation and comparison are performed for all the input process conditions. Once all the process conditions are simulated and checked, in step 1718 a decision is made based on the results of the comparisons. According to one embodiment, if any of the process conditions pass the constraints, then in step 1720 the output is manufacturability "OK" at each passing condition. According to another embodiment, an optimization takes place if any of the process conditions fail the constraints. In this embodiment, the control passes to step 1722 where the mask is altered in order to optimize the mask for improved manufacturability. According to yet another embodiment, a pre-determined threshold is used to determine if the input design or mask layout are considered manufacturability "OK". For example, this threshold could be a preset percentage of conditions, or it may probability weighted depending on the probability weights of the process variations. According to yet another embodiment, in the case where the wafer patterns do not pass the design constraints, the intended and simulated wafer patterns responsible for the constraint violations are identified. Thus, the lithography simulations according to these embodiments provide the capability to do lithography verification for a whole chip (or at least a large chip area), and to take consideration of multiple process variations. The preferred simulation techniques avoid not only repeated simulations, but also repeated construction of model kernels. Lithography verification using process variation simulations improves the robustness of chip manufacturing against process variations, and increase the chip yield.

Figure 18:
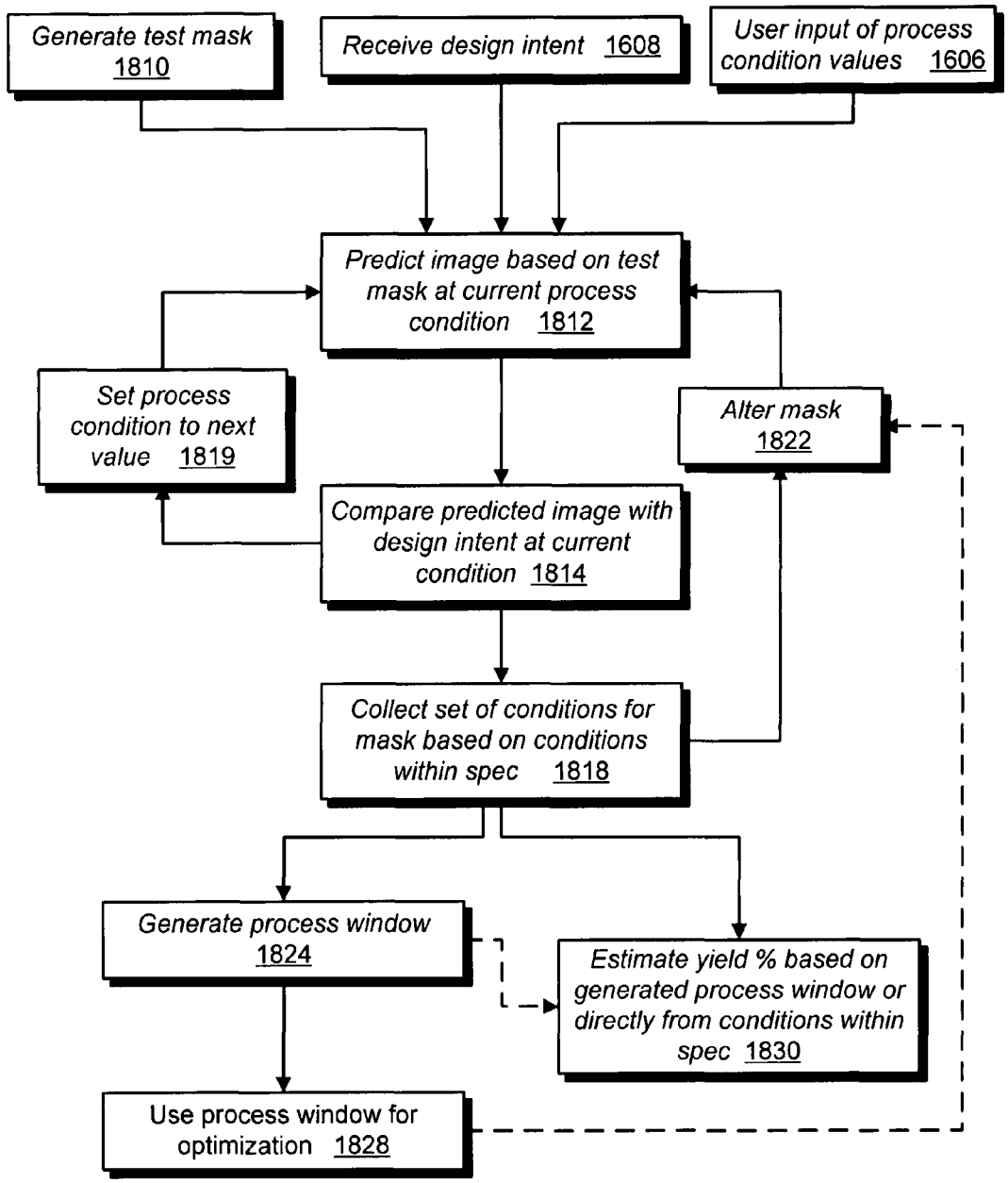
FIG. 18 is a flow chart illustrating further details in estimating a process window and yield, and carrying out optimization in a design setting, according to embodiments.

FIG. 18 is a flow chart illustrating further details in estimating a process window and yield, and carrying out optimization in a design setting, according to embodiments. In steps 1604 and 1606 the input design intent, and the various process conditions are input to the photolithography simulator as described in connection with FIG. 16. For yield estimation, the process conditions input in step 1606 preferably includes the probability distribution of each process variation. In step 1810, a test mask is generated. In step 1812 the wafer patterns are predicted based on the mask at an initial process condition. Preferably, the method and system for computer simulation of photolithography used in photolithography simulator 1610 are as described above. The computer simulations of step 1812 preferably generate and use image intensities at more than one depth in the photoresist. This is in contrast to the conventional methods, which in general do not calculate more than one image at different depths in the photoresist layer. According to a preferred embodiment, in simulation step 1812, multiple image intensities at more than one depth in the photoresist are combined nonlinearly, and the resulted effective image intensity is used to predict the wafer patterns. Advantageously, by taking full consideration of 3D and nonlinear photoresist effects, the capability to obtain high simulation accuracy is provided. In step 1814, the predicted image is compared with the design intent. In step 1819, the process variables set to the next condition values, and then step 1812 is repeated. Steps 1812, 1814 and 1819 are repeated so that the simulation and comparison are performed for all the input process conditions. In step 1818, the conditions at which the design constraints are satisfied are collected. In step 1824, the boundary between yield-OK and yield-loss regions is determined in a hyperspace of process variations (the region enclosed by such boundary is called a hyper process window). The output may be the boundary of yield (equivalently, the hyper process window). According to a further embodiment, the output of step 1824 are selected process variation points on the boundary of yield, the points being associated with reports of failure locations in the design, or places on the verge of failures, together with design constraints violated therein. According to a further embodiment, the output step 1824 can display selected process variation points on the boundary with each point associated with and vicinity linked to a critical failure pattern such as shown and described in connection with FIG. 6. In step 1830, the yield can be calculated from the process window generated in step 1824, or alternatively it can be calculated directly from the set of conditions having the design constraints passed. The probability distribution is preferably known for the process variations, thereby allowing an integration of the probability over the process region resulting in an estimation of yield with respect to the design constraints. Thus, the embodiments described herein advantageously can provide the user with knowledge of hyper process window (equivalently, boundary of yield) which be used to guide lithography verification and process optimization to improve the robustness of chip manufacturing against process variations, or increase the chip yield.

In steps 1822 and 1828, the mask is iteratively revised until a halting criterion (for example, no design constraint violation, or sufficient process window, or sufficient yield, or simply a maximum number of iterations) is reached. The OPC/RET corrections are preferably optimized by maximizing the yield probability for a process window of a specific intended pattern, or a set of intended patterns, or the union of all patterns of a cell or a chip. To reduce the computational complexity, one or several point(s) are preferably identified on the boundary of a given process window that are with the largest probability density, then optimizing the OPC/RET corrections by "pushing" the point(s) outside towards the direction of smaller probability density. The algorithm is preferably run iteratively so as to eventually maximize the desired process window, in the sense of maximizing the yield probability integrated over the process window. This embodiment advantageously provides optimization under process variations so as to render the wafer patterns less sensitive to process variations or improved yield.

Figure 19:
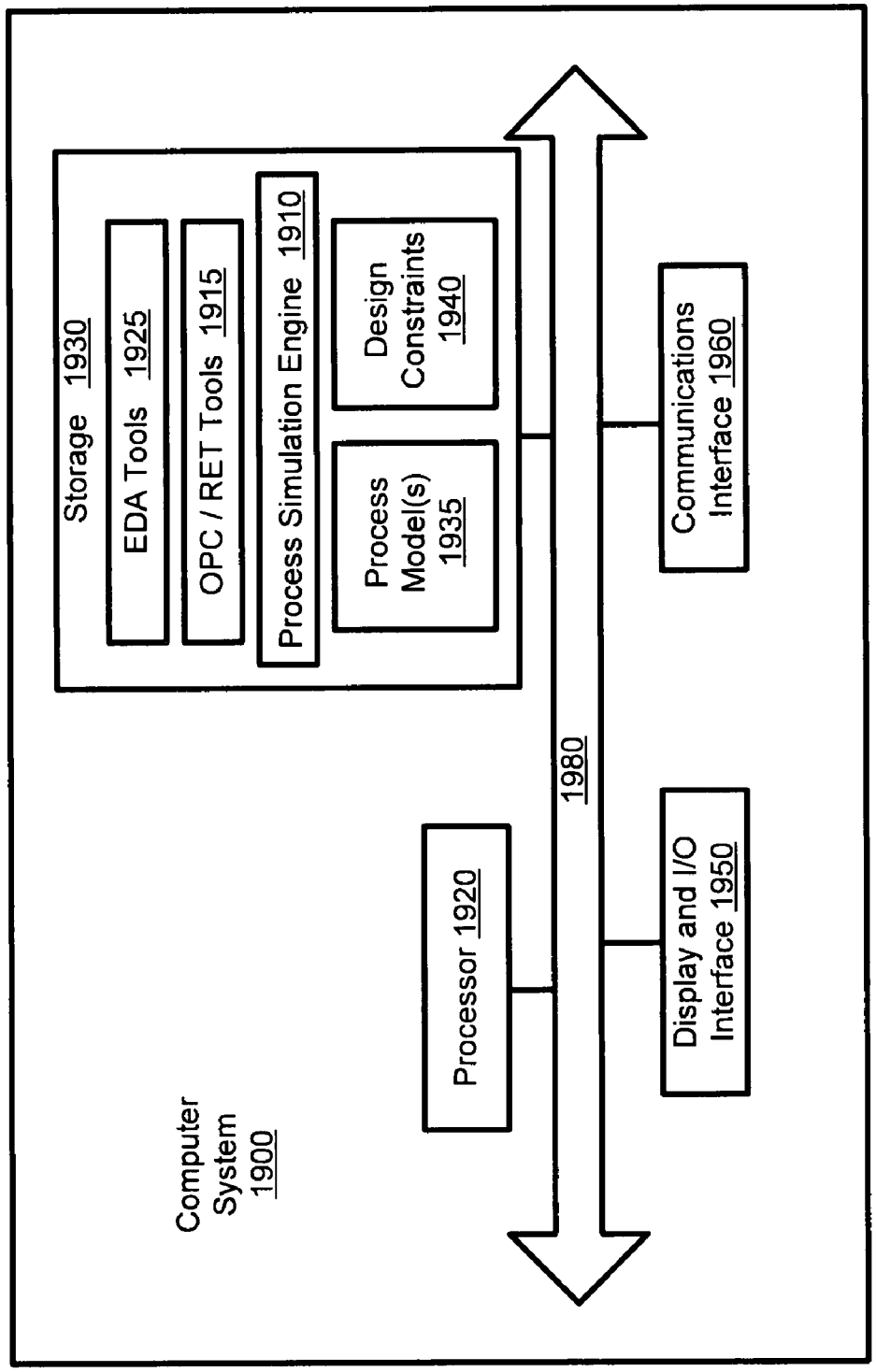
FIG. 19 is a schematic block diagram of a computer system according to embodiments.

FIG. 19 is a schematic block diagram of a computer system 1900 capable of executing a lithography simulation engine 1910, EDA tools 1925, OPC/RET tools 1915 and process models 1935. Computer system 1900 preferably includes one or more processors 1920 used to execute instruction that carry out a specified logic routine. In addition, the computer system 1900 includes storage 1930, which includes memory (both volatile and non-volatile, hard disks, optical media, etc. The processor 1920 and storage 1930 are coupled using a local interface 1980, which can be for example a data bus, accompanying control bus, a network or other subsystem. The computer system 1900 preferably includes various video and input/output interfaces 1950 as well as one or more communications interfaces 1960. The interfaces 1950 can be used to couple the computer system 1900 to various peripherals and networked devices, such as a display (e.g., a CRT display or LCD display), a keyboard, a mouse, a microphone, a camera, a scanner, a printer, a speaker, and so forth. The communications interfaces 1960 can be comprised of, for example, a modem and/or network interface card, and can enable the computer system 1900 to send and receive data signals, voice signals, video signals, and the like via an external network, such as the Internet, a wide area network (WAN), a local area network (LAN), direct data link, or similar wired or wireless system. The storage can store an operating system that is executed by the processor 1920 to control the allocation and usage of resources in the computer system 1900. Specifically, the operating system controls the allocation and usage of the storage 1930.

Whereas many alterations and modifications of the present invention will no doubt become apparent to a person of ordinary skill in the art after having read the descriptions herein, it is to be understood that the particular preferred embodiments shown and described by way of illustration are in no way intended to be considered limiting. Therefore, reference to the details of the preferred and other embodiments are not intended to limit their scope, which is limited only by the scope of the claims set forth below.

What is claimed is:

1. A method for designing an integrated circuit comprising:
receiving a geometrical design intent for at least a portion of the integrated circuit;
receiving at least a first value and a second value for at least one process variation associated with a photolithographic process to be used in fabricating the integrated circuit;
simulating with a processing system the photolithographic process at the first and second values for the at least one process variation using one or more models characterizing the photolithographic process and the geometrical design intent to generate simulation results, wherein said first and second values were not used in generation of said one or more models; and
in response to said simulation results, re-routing a portion of the geometrical design intent so as to improve manufacturability of the integrated circuit.

2. The method of claim 1, further comprising receiving at least a third value and a fourth value for a second process variation associated with the photolithographic process.

3. The method of claim 1, wherein said at least one process variation is selected from a group consisting of: exposure dose variations, intensity variations of multiple light emitters, light source chromatic variations, coherence variations, light source positioning variations, defocus variations, lens aberrations, exposure-field-dependent defocus variations and lens aberrations, immersion medium refractive index variations, immersion medium attenuation coefficient variations, stack film thickness variations, stack film material refractive index variations, stack film material attenuation coefficient variations, mask pattern errors, mask topography variations, mask material property variations, and other mask errors, photoresist optical property variations, photoresist chemical property variations, photoresist-development material variations, photoresist-development environment variations, photoresist-development process variations, etching material variations, etching environment variations, etching process variations, temperature variations, pressure variations, and processing time variations of different process steps.

4. The method of claim 1, wherein said step of simulating comprises simulating the photolithographic process using the one or more models over a substantially large physical area of said integrated circuit.

5. The method of claim 4, wherein said step of simulating further comprises simulating the photolithographic process using the one or more models over an area in which a ratio of the area over square of a critical dimension of the geometrical design intent is at least $10^6$.

6. The method of claim 5, wherein said step of simulating further comprises simulating the photolithographic process using the one or more models over an area in which a ratio of the area over a square of a critical dimension of the geometrical design intent is at least $10^8$.

7. The method of claim 6, wherein said step of simulating further comprises simulating the photolithographic process using the one or more models over substantially the entire area of the integrated circuit.

8. The method of claim 1, further comprising a step of estimating a value for yield of the integrated circuit based at least in part on the simulation results.

9. The method of claim 8, wherein said step of re-routing is in part in response to the outcome of said step of estimating a value for yield.

10. The method of claim 1, further comprising a step of identifying one or more locations on the geometrical design intent associated with potential failures based on the simulation results.

11. The method of claim 1, wherein said step of receiving comprises receiving a plurality of process conditions, each process condition comprising a condition value for each of a plurality of process variations associated with the photolithographic process, and wherein said step of simulating comprises simulating the photolithographic process at each process condition, the method further comprises steps of:
receiving one or more design constraints to aid in determining if the geometrical design intent will lead to a functioning integrated circuit; and
estimating, for each process condition whether design constraints will have been satisfied based upon the simulation results.

12. The method of claim 11, further comprising a step of determining a boundary between passing and failing the design constraints within space of the process variations.

13. The method of claim 12, further comprising a step of displaying the boundary to the user.

14. The method of claim 11, further comprising a step of identifying for at least one condition under which the design constraints are not satisfied, at least one location on the geometrical design intent related to the failure to satisfy.

15. The method of claim 11, further comprising a step of identifying for at least one condition under which the design constraints are not satisfied, at least one type of wafer pattern related to the failure to satisfy.

16. The method of claim 11, wherein said step of re-routing is in part in response to an outcome of said step of estimating.

17. A computer program product on a computer readable medium comprising computer code that, when executed on a computing device, provides a capability of designing an integrated circuit according to the method of claim 1.

18. A system for designing an integrated circuit comprising:
a computer input/output system adapted to receive a geometrical design intent for at least a portion of the integrated circuit, and receive at least a first value and a second value for at least one process variation associated with a photolithographic process to be used in fabricating the integrated circuit;
a processor configured and programmed to simulate the photolithographic process at the first and second values for the at least one process variation using one or more models characterizing the photolithographic process and the geometrical design intent to generate simulation results, wherein said first and second values were not used in generation of said one or more models; and
a computer system for re-routing a portion of the geometrical design intent so as to improve manufacturability of the integrated circuit.

19. The system as in claim 18, wherein the computer system for re-routing is adapted to receive input guidance from a user.

20. The system as in claim 18, wherein said at least one process variation is selected from a group consisting of: exposure dose variations, intensity variations of multiple light emitters, light source chromatic variations, coherence variations, light source positioning variations, defocus variations, lens aberrations, exposure-field-dependent defocus variations and lens aberrations, immersion medium refractive index variations, immersion medium attenuation coefficient variations, stack film thickness variations, stack film material refractive index variations, stack film material attenuation coefficient variations, mask pattern errors, mask topography variations, mask material property variations, and other mask errors, photoresist optical property variations, photoresist chemical property variations, photoresist-development material variations, photoresist-development environment variations, photoresist-development process variations, etching material variations, etching environment variations, etching process variations, temperature variations, pressure variations, and processing time variations of different process steps.

21. The system of claim 18, wherein said processor is further configured and programmed to simulate the photolithographic process using the one or more models over a substantially large physical area of said integrated circuit.

22. The system of claim 21, wherein a ratio of an area over square of a critical dimension of the geometrical design intent is at least $10^6$.

23. The system of claim 22, wherein said processor is further configured and programmed to simulate the photolithographic process over substantially the entire area of the integrated circuit.

24. The system of claim 21, wherein a ratio of an area over square of a critical dimension of the geometrical design intent is at least $10^8$.

25. The system of claim 18, wherein said processor is further configured and programmed to estimate a value for yield of the integrated circuit based at least in part on the simulation results.

26. The system of claim 25, wherein the re-routing is in part performed in response to an outcome of said action of estimating a value for yield.

27. The system of claim 18, wherein said processor is further configured and programmed to identify one or more locations on the geometrical design intent associated with potential failures based on the simulation results.

28. The system of claim 18, wherein said computer input/output system is further adapted to receive a plurality of process conditions, each process condition comprising a condition value for each of a plurality of process variations associated with the photolithographic process, and to receive one or more design constraints to aid in determining if the geometrical design intent will lead to a functioning integrated circuit, and wherein said processor is further configured and programmed to simulate the photolithographic process at each process condition, and to estimate, for each process condition, whether the design constraints will have been satisfied based upon the simulation results.

29. The system of claim 28, wherein said processor is further configured and programmed to determine a boundary between passing and failing the design constraints within space of the process variations.

30. The system of claim 29, further comprising a display system adapted to display the boundary to a user.

31. The system of claim 28, wherein the processor is further configured and programmed to identify for at least one condition under which the design constraints are not satisfied, at least one location on the design related to the failure to satisfy.

32. The system of claim 28, wherein the re-routing is in part performed in response to an outcome of said action of estimating.

33. A method for designing an integrated circuit comprising:
   receiving a geometrical design intent for at least a portion of the integrated circuit;
   receiving at least a first value and a second value for at least one process variation associated with a photolithographic process to be used in fabricating the integrated circuit;
   simulating with a processing system the photolithographic process using one or more models characterizing the photolithographic process and the geometrical design intent to generate simulation results;
   estimating a quantitative value for yield of the integrated circuit based at least in part on the simulation results; and
   in response to said simulation results, re-routing a portion of the geometrical design intent so as to improve manufacturability of the integrated circuit.

34. The method of claim 33, wherein said at least one process variation is selected from a group consisting of: exposure dose variations, intensity variations of multiple light emitters, light source chromatic variations, coherence variations, light source positioning variations, defocus variations, lens aberrations, exposure-field-dependent defocus variations and lens aberrations, immersion medium refractive index variations, immersion medium attenuation coefficient variations, stack film thickness variations, stack film material refractive index variations, stack film material attenuation coefficient variations, mask pattern errors, mask topography variations, mask material property variations, and other mask errors, photoresist optical property variations, photoresist chemical property variations, photoresist-development material variations, photoresist-development environment variations, photoresist-development process variations, etching material variations, etching environment variations, etching process variations, temperature variations, pressure variations, and processing time variations of different process steps.

35. The method of claim 33, wherein said step of simulating comprises simulating the photolithographic process using the one or more models over a substantially large physical area of said integrated circuit.

36. The method of claim 35, wherein said step of simulating further comprises simulating the photolithographic process using the one or more models over an area in which a ratio of the area over square of a critical dimension of the geometrical design intent is at least $10^8$.

37. The method of claim 36, wherein said step of simulating further comprises simulating the photolithographic process using the one or more models over substantially the entire area of the integrated circuit.

38. The method of claim 33, further comprising a step of identifying one or more locations on the geometrical design intent associated with potential failures based on the simulation results.

39. The method of claim 33, wherein said step of receiving comprises receiving a plurality of process conditions, each process condition comprising a condition value for each of a plurality of process variations associated with the photolithographic process, and wherein said step of simulating comprises simulating the photolithographic process at each process condition, the method further comprises the steps of:
   receiving one or more design constraints to aid in determining if the geometrical design intent will lead to a functioning integrated circuit; and
   estimating, for each process condition whether design constraints will have been satisfied based upon the simulation results.

40. The method of claim 39, further comprising a step of determining a boundary between passing and failing the design constraints within space of the process variations.

41. The method of claim 39, further comprising a step of identifying for at least one condition under which the design constraints are not satisfied, at least one location on the geometrical design intent related to the failure to satisfy.

42. The method of claim 33, wherein said step of re-routing is in part in response to an outcome of said step of estimating a value for yield.

43. A method for simulating a photolithographic process of a design onto a target comprising:
   simulating with a processing system the photolithographic process over a substantially large physical area of the target for a plurality of values of at least one process variation associated with the photolithographic process, wherein the at least one process variation is neither dose/exposure nor focus/defocus;
   receiving a plurality of process conditions, each process condition comprising a condition value for each of a plurality of process variations associated with the photolithographic process, wherein said step of simulating includes simulating for each of the plurality of process conditions;
   receiving one or more design constraints to aid in determining if the design will lead to a functioning integrated circuit; and
   estimating, for each process condition whether the design constraints will have been satisfied based upon simulation results generated by said step of simulating.

44. The method of claim 43, wherein said step of simulating comprises simulating the photolithographic process at a plurality of depths within the target.

45. The method of claim 43, wherein said step of simulating comprises simulating the photolithographic process on a plurality of portions of the target, the method further comprising a step of combining results of said simulations on said plurality of portions of the target.

46. The method of claim 43, wherein said at least one process variation is selected from a group consisting of: exposure dose variations, intensity variations of multiple light emitters, light source chromatic variations, coherence variations, light source positioning variations, defocus variations, lens aberrations, exposure-field-dependent defocus variations and lens aberrations, immersion medium refractive index variations, immersion medium attenuation coefficient variations, stack film thickness variations, stack film material refractive index variations, stack film material attenuation coefficient variations, mask pattern errors, mask topography variations, mask material property variations, and other mask errors, photoresist optical property variations, photoresist chemical property variations, photoresist-development material variations, photoresist-development environment variations, photoresist-development process variations, etching material variations, etching environment variations, etching process variations, temperature variations, pressure variations, and processing time variations of different process steps.

47. The method of claim 43 wherein said step of simulating further comprises simulating the photolithographic process over an area on the target in which a ratio of the area over square of a critical dimension of the design is at least $10^6$.

48. The method of claim 47 wherein said step of simulating further comprises simulating the photolithographic process over an area on the target in which a ratio of the area over square of a critical dimension of the design is at least $10^8$.

49. The method of claim 48, wherein said step of simulating further comprises simulating the photolithographic process over substantially the entire design.

50. The method of claim 43, further comprising a step of estimating a value for yield of the design based at least in part on results of said step of simulating.

51. The method of claim 43, wherein the design is a geometrical design intent.

52. The method of claim 43, wherein the design is a mask layout.

53. The method of claim 43, further comprising a step of determining a boundary between passing and failing the design constraints within space of the process variations.

54. The method of claim 53, further comprising a step of displaying the boundary to the user.

55. The method of claim 43, further comprising a step of identifying for at least one condition under which the design constraints are not satisfied, at least one location on the design related to the failure to satisfy.

56. The method of claim 43, further comprising a step of identifying for at least one condition under which the design constraints are not satisfied, at least one type of wafer pattern related to the failure to satisfy.

57. The method of claim 43, further comprising a step of altering a mask used in the photolithographic process based at least in part on said step of estimating, and so as to improve manufacturability of the mask.

58. The method of claim 43, further comprising a step of changing parameters of equipment used in the photolithographic process in response to said step of estimating.

59. The method of claim 58, further comprising a step of altering the design of at least some part of the equipment based in part on results of said step of estimating.

60. The method of claim 43 wherein the design is a test pattern.

61. A computer program product on a computer readable medium comprising computer code that, when executed on a computing device, simulates a photolithographic process in according to the method of claim 43.

62. A system for simulating a photolithographic process comprising:
a computer input/output system adapted and configured to receive a design and a plurality of process conditions, each process condition comprising a value for each of a plurality of process variations associated with the photolithographic process, wherein at least one of said process conditions is neither dose/exposure nor focus/defocus; and
a processor configured and programmed to simulate the photolithographic process over a substantially large physical area of a target of the design at each of the plurality of process conditions, wherein the computer input/output system is further adapted to receive one or more design constraints to aid in determining if the design will lead to a functioning integrated circuit, and the processor is further configured and programmed to estimate for each process condition whether the design constraints will have been satisfied based upon simulation results generated by simulating the photolithographic process.

63. The system of claim 62, wherein said processor is further configured and programmed to simulate the photolithographic process at a plurality of depths within the target.

64. The system of claim 62, wherein said processor is further configured and programmed to simulate the photolithographic process on a plurality of portions of the target, and to combine results of simulations on said plurality of portions of the target.

65. The system of claim 62, wherein the plurality of process variations is selected from a group consisting of: exposure dose variations, intensity variations of multiple light emitters, light source chromatic variations, coherence variations, light source positioning variations, defocus variations, lens aberrations, exposure-field-dependent defocus variations and lens aberrations, immersion medium refractive index variations, immersion medium attenuation coefficient variations, stack film thickness variations, stack film material refractive index variations, stack film material attenuation coefficient variations, mask pattern errors, mask topography variations, mask material property variations, and other mask errors, photoresist optical property variations, photoresist chemical property variations, photoresist-development material variations, photoresist-development environment variations, photoresist-development process variations, etching material variations, etching environment variations, etching process variations, temperature variations, pressure variations, and processing time variations of different process steps.

66. The system of claim 62 wherein a ratio of substantially large physical area over square of a critical dimension of the design is at least $10^6$.

67. The system of claim 62 wherein a ratio of substantially large physical area over square of a critical dimension of the design is at least $10^8$.

68. The system of claim 67, wherein a simulation takes place over substantially the entire design.

69. The system of claim 62, where the processor is further configured and programmed to estimate a value for yield of the design based at least in part on results of a simulation.

70. The system of claim 62, wherein the processor is further configured and programmed to determine a boundary between passing and failing the design constraints within a space of the process variations.

71. The system of claim 70, further comprising a display system adapted to display the boundary to a user.

72. The system of claim 62, wherein the processor is further configured and programmed to identify for at least one condition under which the design constraints are not satisfied, at least one location on the design related to the failure to satisfy.

73. The system of claim 62, wherein the processor is further configured and programmed to alter a mask used in the photolithographic process based at least in part on estimation for each process condition whether the design constraints will have been satisfied so as to improve manufacturability of the mask.

74. A method for simulating a photolithographic process of a design onto a target comprising:
simulating with a processing system the photolithographic process over a substantially large area on the target and at a plurality of depths within said target;

receiving a plurality of process conditions, each process condition comprising a condition value for each of a plurality of process variations associated with the photolithographic process, wherein said step of simulating includes simulating for each of the plurality of process conditions;

receiving one or more design constraints to aid in determining if the design will lead to a functioning integrated circuit; and estimating, for each process condition, whether said design constraints will have been satisfied based upon simulation results.

75. The method of claim 74, wherein the design is a geometrical design intent.

76. The method of claim 74, wherein the design is a mask layout.

77. The method of claim 74, further comprising a step of determining a boundary between passing and failing the design constraints within space of the process variations.

78. The method of claim 77, further comprising a step of displaying the boundary to the user.

79. The method of claim 74, further comprising a step of identifying for at least one condition under which the design constraints are not satisfied, at least one location on the design related to the failure to satisfy.

80. The method of claim 74, further comprising a step of identifying for at least one condition under which the design constraints are not satisfied, at least one type of wafer pattern related to the failure to satisfy.

81. The method of claim 74, further comprising a step of altering a mask used in the photolithographic process based at least in part on said step of estimating, and so as to improve manufacturability of the mask.

82. The method of claim 74, further comprising a step of changing a parameters of equipment used in the photolithographic process in response to said step of estimating.

83. The method of claim 74, further comprising a step of altering the design of at least some part of the equipment based in part on results of said step of estimating.

84. The method of claim 74 wherein the design is a test pattern.

85. A method for simulating a photolithographic process of a design onto a target comprising:

simulating with a processing system the photolithographic process repeatedly of different portions of the design onto a plurality of different portions of the target, according to a plurality of values of at least one process variation associated with the photolithographic process, wherein the at least one process variation is neither dose/exposure nor focus/defocus;

combining results of said repeated simulations performed in said step of simulating;

receiving a plurality of process conditions, each process condition comprising a condition value for each of a plurality of process variations associated with the photolithographic process, wherein said step of simulating includes simulating for each of the plurality of process conditions;

receiving one or more design constraints to aid in determining if the design will lead to a functioning integrated circuit; and estimating, for each process condition, whether said design constraints will have been satisfied based upon simulation results generated by said step of simulating.

86. The method of claim 85, wherein said step of simulating comprises simulating the photolithographic process at a plurality of depths within a photolithography target.

87. The method of claim 85, wherein said step of simulating is performed over a substantially large physical area.

88. The method of claim 85, wherein said the plurality of process variations are selected from a group consisting of: exposure dose variations, intensity variations of multiple light emitters, light source chromatic variations, coherence variations, light source positioning variations, defocus variations, lens aberrations, exposure-field-dependent defocus variations and lens aberrations, immersion medium refractive index variations, immersion medium attenuation coefficient variations, stack film thickness variations, stack film material refractive index variations, stack film material attenuation coefficient variations, mask pattern errors, mask topography variations, mask material property variations, and other mask errors, photoresist optical property variations, photoresist chemical property variations, photoresist-development material variations, photoresist-development environment variations, photoresist-development process variations, etching material variations, etching environment variations, etching process variations, temperature variations, pressure variations, and processing time variations of different process steps.

89. The method of claim 85 wherein said step of simulating further comprises simulating the photolithographic process over an area on the target in which a ratio of the area over square of a critical dimension of the design is at least $10^6$.

90. The method of claim 89 wherein said step of simulating further comprises simulating the photolithographic process over an area on the target in which a ratio of the area over square of a critical dimension of the design is at least $10^8$.

91. The method of claim 90, wherein said step of simulating further comprises simulating the photolithographic process over substantially the entire area of the design.

92. The method of claim 85, further comprising a step of estimating a value for yield of the design based at least in part on results of said step of simulating.

93. The method of claim 85, further comprising a step of determining a boundary between passing and failing the design constraints within space of the process variations.

94. The method of claim 93, further comprising a step of displaying the boundary to the user.

95. The method of claim 85, further comprising a step of identifying for at least one condition under which the design constraints are not satisfied, at least one location on the design related to the failure to satisfy.

96. The method of claim 85, further comprising a step of identifying for at least one condition under which the design constraints are not satisfied, at least one type of wafer pattern related to the failure to satisfy.

97. The method of claim 85, further comprising a step of altering a mask used in the photolithographic process based at least in part on said step of estimating, and so as to improve manufacturability of the mask.

98. The method of claim 95, further comprising a step of changing parameters of equipment used in the photolithographic process in response to said step of estimating.

99. The method of claim 98, further comprising a step of altering the design of at least some part of the equipment based in part on results of said step of estimating.

100. The method of claim 85 wherein the design is a test pattern.

* * * * *